(12) United States Patent
Mimura et al.

(10) Patent No.: US 9,780,514 B2
(45) Date of Patent: Oct. 3, 2017

(54) COMPONENT MOUNTING METHOD

(71) Applicant: PANASONIC INTELLECTUAL PROPERTY MANAGEMENT CO., LTD., Osaka (JP)

(72) Inventors: Yoshihiro Mimura, Osaka (JP); Ryuji Hamada, Osaka (JP); Akira Kameda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 236 days.

(21) Appl. No.: 14/422,512

(22) PCT Filed: Aug. 16, 2013

(86) PCT No.: PCT/JP2013/004879
§ 371 (c)(1),
(2) Date: Feb. 19, 2015

(87) PCT Pub. No.: WO2014/030326
PCT Pub. Date: Feb. 27, 2014

(65) Prior Publication Data
US 2015/0222071 A1    Aug. 6, 2015

(30) Foreign Application Priority Data

Aug. 22, 2012  (JP) .................................. 2012-182911
Sep. 3, 2012  (JP) .................................. 2012-192890

(51) Int. Cl.
*H01R 43/042*    (2006.01)
*H01R 43/048*    (2006.01)
(Continued)

(52) U.S. Cl.
CPC .......... *H01R 43/048* (2013.01); *H01L 24/27* (2013.01); *H01L 24/32* (2013.01); *H01L 24/743* (2013.01);
(Continued)

(58) Field of Classification Search
CPC . H01L 2924/00012; H01L 2924/00014; H01L 2224/2929; H01L 2224/293;
(Continued)

(56) References Cited

U.S. PATENT DOCUMENTS 3,765,075 A * 10/1973 Olney, Jr. ............ H05K 13/043
                                                227/104
4,748,741 A *  6/1988 Donovan ................ B23P 19/02
                                                227/104

(Continued)

FOREIGN PATENT DOCUMENTS

CN    101171675 A    4/2008
CN    102196720 A    9/2011
(Continued)

OTHER PUBLICATIONS

Chinese Office Action and Search Report issued in Chinese Patent Application 201380044132.8 dated Aug. 23, 2016.
(Continued)

*Primary Examiner* — Minh Trinh
(74) *Attorney, Agent, or Firm* — Pearne & Gordon LLP

(57) ABSTRACT

While a substrate is placed on a substrate placement stage provided in a central substrate transfer unit, the substrate is transferred to a component loading operation unit, after operation for loading a component on the substrate has been performed by the component loading operation unit, the central substrate transfer unit is moved to the side of a first component crimping operation unit to thereby transfer the substrate that remains placed on the substrate placement
(Continued)

stage to the first component crimping operation unit, and the component is crimped to the substrate by the first component crimping operation unit.

2 Claims, 21 Drawing Sheets

(51) Int. Cl.
H01L 23/00 (2006.01)
H05K 3/32 (2006.01)
H05K 3/30 (2006.01)
G02F 1/13 (2006.01)

(52) U.S. Cl.
CPC .............. *H01L 24/75* (2013.01); *H01L 24/83* (2013.01); *H05K 3/301* (2013.01); *H05K 3/323* (2013.01); *G02F 1/1303* (2013.01); *H01L 24/29* (2013.01); *H01L 2224/27334* (2013.01); *H01L 2224/293* (2013.01); *H01L 2224/2929* (2013.01); *H01L 2224/32014* (2013.01); *H01L 2224/32105* (2013.01); *H01L 2224/32225* (2013.01); *H01L 2224/756* (2013.01); *H01L 2224/759* (2013.01); *H01L 2224/7565* (2013.01); *H01L 2224/7598* (2013.01); *H01L 2224/75301* (2013.01); *H01L 2224/75621* (2013.01); *H01L 2224/75701* (2013.01); *H01L 2224/75702* (2013.01); *H01L 2224/75744* (2013.01); *H01L 2224/75745* (2013.01); *H01L 2224/75753* (2013.01); *H01L 2224/75755* (2013.01); *H01L 2224/75804* (2013.01); *H01L 2224/75901* (2013.01); *H01L 2224/83101* (2013.01); *H01L 2224/83121* (2013.01); *H01L 2224/83132* (2013.01); *H01L 2224/83192* (2013.01); *H01L 2224/83203* (2013.01); *H01L 2224/83851* (2013.01); *H05K 2203/0278* (2013.01); *Y10T 29/4914* (2015.01); *Y10T 29/53174* (2015.01)

(58) Field of Classification Search
CPC ....... H01L 2224/7565; H01L 2224/759; B23P 11/005; H01R 43/205; H01R 12/69
See application file for complete search history.

(56) References Cited

U.S. PATENT DOCUMENTS

| | | | |
|---|---|---|---|
| 6,076,394 A * | 6/2000 | Tsuda ................. | H05K 13/0408 29/743 |
| 7,654,512 B2 | 2/2010 | Kawata et al. | |
| 7,850,800 B2 | 12/2010 | Ueno et al. | |
| 2006/0055766 A1 | 3/2006 | Kawata et al. | |
| 2008/0193262 A1 | 8/2008 | Tsuji et al. | |
| 2009/0065120 A1 | 3/2009 | Ueno et al. | |
| 2016/0113164 A1* | 4/2016 | Kameda ................. | B23P 11/005 29/743 |

FOREIGN PATENT DOCUMENTS

| | | |
|---|---|---|
| JP | H11-261214 A | 9/1999 |
| JP | 2005-129753 A | 5/2005 |
| JP | 2006-093534 A | 4/2006 |
| JP | 2006-222286 A | 8/2006 |
| JP | 2010-171088 A | 8/2010 |

OTHER PUBLICATIONS

International Search Report for Application No. PCT/JP2013/004879 dated Sep. 17, 2013.

* cited by examiner

COMPONENT MOUNTING METHOD

TECHNICAL FIELD

The present invention relates to a component mounting device and a component mounting method for performing manufacturing of substrates such as liquid crystal panel substrates by loading components on the substrates and then crimping the components on the substrate.

BACKGROUND ART

In the related art, component mounting devices for manufacturing liquid crystal panel substrates are provided with an ACF attachment operation unit that attaches a tape-shaped anisotropic conductive film (ACF) as an adhesion member to an end portion of the substrate, a component loading operation unit that loads (provisionally crimps) the component which has a film-shaped part such as a drive circuit on a part of the substrate where the ACF tape is attached, and component crimping operation units that crimp (perform main crimping of) the component on the substrate where the component is loaded by the component loading operation unit. Herein, the number of the component crimping operation units is two in most cases, and the ACF attachment operation unit, the component loading operation unit, a first component crimping operation unit, and a second component crimping operation unit are arranged in this order along substrate flow (for example, refer to PTL 1). Delivery of the substrate during the operation process described above is performed by a substrate transfer unit such as an arm device which is provided with a substrate adsorption unit at a tip, and processing is carried out while the substrate is being delivered during the operation process.

Some of the component mounting devices of the related art described above are component mounting devices that attach the component to only one side of the substrate. In this case, the first component crimping operation unit and the second component crimping operation unit perform the same operation. Accordingly, a component crimping operation is performed on the one side of the substrate where the component loading operation is performed by the first component crimping operation unit or the second component crimping operation unit.

CITATION LIST

Patent Literature

PTL 1: JP-A-2005-129753

SUMMARY OF INVENTION

Technical Problem

In the component mounting device that loads the component which has the film-shaped part on the end portion of the substrate as described above, the component that is loaded on the substrate may be dropped by a shock during the transfer of the substrate by the substrate transfer unit during the course of transition from the component loading operation to the component crimping operation.

An object of the present invention is to provide a component mounting device and a component mounting method allowing transition to a component crimping operation without dropping a component that is loaded on a substrate.

Solution to Problem

A component mounting device, according to the present invention, includes: a component loading operation unit that performs an operation for loading components on a substrate; a first component crimping operation unit and a second component crimping operation unit that are disposed at positions pinching the component loading operation unit from both sides and crimp the component loaded by the component loading operation unit on the substrate where the operation for loading the component is performed by the component loading operation unit; a first substrate transport unit that is disposed to be movable in a horizontal direction between the component loading operation unit and the first component crimping operation unit, transports the substrate to the component loading operation unit in a state where the substrate is placed on a substrate placement stage, and transports the substrate in a state of remaining placed on the substrate placement stage to the first component crimping operation unit by moving to the first component crimping operation unit side after the operation for loading the component on the substrate is performed by the component loading operation unit; and a second substrate transport unit that is disposed to be movable in the horizontal direction between the component loading operation unit and the second component crimping operation unit, transports the substrate to the component loading operation unit in a state where the substrate is placed on the substrate placement stage, and transports the substrate in a state of remaining placed on the substrate placement stage to the second component crimping operation unit by moving to the second component crimping operation unit side after the operation for loading the component on the substrate is performed by the component loading operation unit.

The component mounting device according to the present invention includes: a substrate holding section that holds the substrate which is carried from outside; an adhesion member attachment operation unit that attaches an adhesion member to a site of the substrate held by the substrate holding section where the component is loaded by the component loading operation unit; and a substrate transfer unit that places the substrate, to which the adhesion member is attached by the adhesion member attachment operation unit, on the substrate placement stage of the first substrate transport unit and the substrate placement stage of the second substrate transport unit through sorting.

In the component mounting device according to the present invention, the substrate transfer unit delivers the substrate to a substrate unloading unit after receiving the substrate on which the component is crimped by the first component crimping operation unit from the substrate placement stage of the first substrate transport unit or receiving the substrate on which the component is crimped by the second component crimping operation unit from the substrate placement stage of the second substrate transport unit.

In the component mounting device according to the present invention, the component loading operation unit includes a position recognition unit that performs recognition of a position of the substrate on the substrate placement stage of the first substrate transport unit or recognition of a position of the substrate on the substrate placement stage of the second substrate transport unit before performing the operation for loading the component on the substrate transported by the first substrate transport unit or the substrate transported by the second substrate transport unit.

In the component mounting device according to the present invention, the component that is loaded on the substrate by the component loading operation unit has a film-shaped part which protrudes from the substrate in a state where the component is loaded on the substrate, and the substrate placement stage of the first substrate transport unit and the substrate placement stage of the second substrate transport unit have film-shaped part supporting sections which support the film-shaped part from below in a state where the component is loaded on the substrate.

The component mounting device according to the present invention includes an information acquisition unit that recognizes the substrate that is placed on the substrate placement stage by using a recognition unit and acquires information relating to the position of the substrate, and the first substrate transport unit performs positioning of the substrate with respect to the component loading operation unit and positioning of the substrate with respect to the first component crimping operation unit by moving the substrate placement stage based on the information acquired by the information acquisition unit.

In the component mounting device according to the present invention, the first substrate transport unit stores the information acquired by the information acquisition unit in a storage unit, and performs the positioning of the substrate with respect to the first component crimping operation unit based on the information stored in the storage unit.

A component mounting method according to the present invention is a method by a component mounting device including a component loading operation unit that performs an operation for loading components on a substrate, a first component crimping operation unit and a second component crimping operation unit that are disposed at positions pinching the component loading operation unit from both sides and crimp the component loaded by the component loading operation unit on the substrate where the operation for loading the component is performed by the component loading operation unit, a first substrate transport unit disposed to be movable in a horizontal direction between the component loading operation unit and the first component crimping operation unit, and a second substrate transport unit disposed to be movable in the horizontal direction between the component loading operation unit and the second component crimping operation unit. And the method includes: a step of crimping the component on the substrate by the first component crimping operation unit by transporting the substrate in a state of remaining placed on a substrate placement stage to the first component crimping operation unit by moving the first substrate transport unit to the first component crimping operation unit side after transporting the substrate to the component loading operation unit in a state where the substrate is placed on the substrate placement stage of the first substrate transport unit and performing the operation for loading the component on the substrate by the component loading operation unit; and a step of crimping the component on the substrate by the second component crimping operation unit by transporting the substrate in a state of remaining placed on the substrate placement stage to the second component crimping operation unit by moving the second substrate transport unit to the second component crimping operation unit side after transporting the substrate to the component loading operation unit in a state where the substrate is placed on the substrate placement stage of the second substrate transport unit and performing the operation for loading the component on the substrate by using the component loading operation unit.

The component mounting method according to the present invention includes an information acquiring step of acquiring information relating to a position of the substrate by recognizing the substrate that is placed on the substrate placement stage; a first substrate positioning step of performing positioning of the substrate with respect to the component loading operation unit by moving the substrate placement stage based on the information that is acquired in the information acquiring step; and a second substrate positioning step of performing the positioning of the substrate with respect to the first component crimping operation unit by moving the substrate placement stage to the first component crimping operation unit after the loading operation and moving the substrate placement stage based on the information that is acquired in the information acquiring step.

Advantageous Effects of Invention

According to the present invention, the component loading operation is performed after the substrate is transported to the component loading operation unit in a state where the substrate remains placed on the substrate placement stage of the first substrate transport unit or the second substrate transport unit. After the component loading operation, the substrate is transported to the first component crimping operation unit or the second component crimping operation unit in a state where the substrate is placed on the substrate placement stage so that the component crimping operation is performed. Accordingly, the transfer of the substrate by the substrate transfer unit does not occur during the course of the transition from the component loading operation to the component crimping operation, and the transition to the component crimping operation can be carried out without dropping the component that is loaded on the substrate.

DESCRIPTION OF EMBODIMENTS

Figure 1:
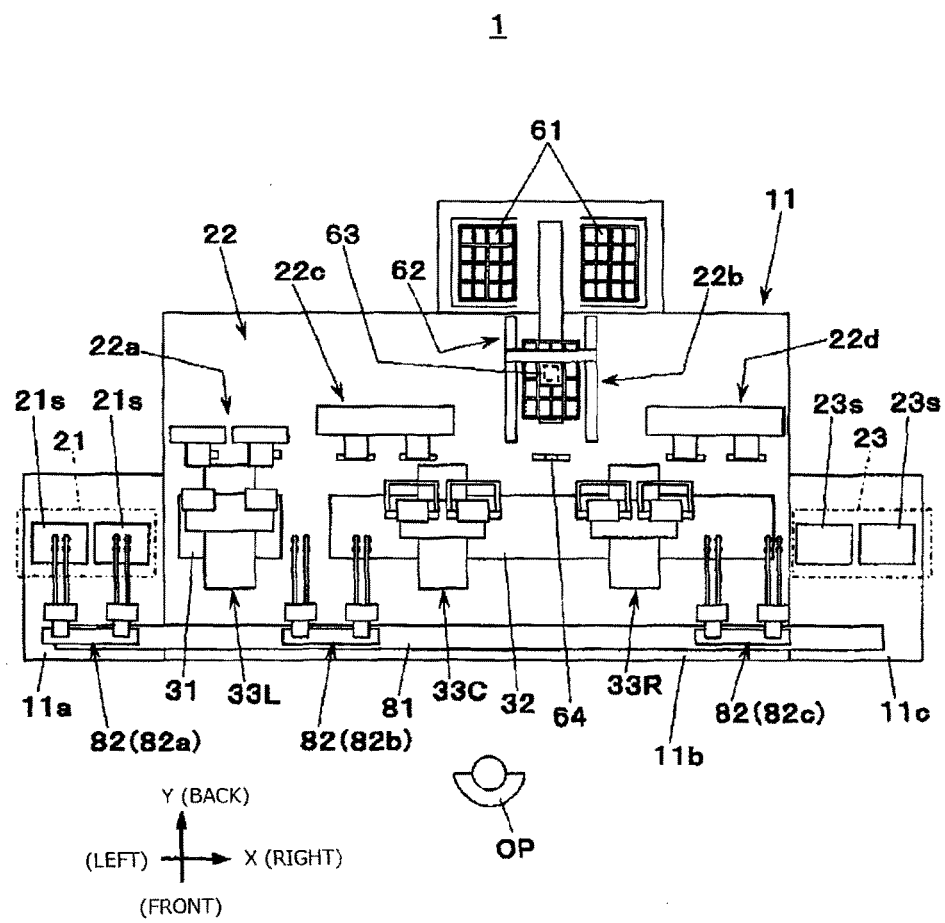
FIG. 1 is a plan view of a component mounting device according to an embodiment of the present invention.

Hereinafter, an embodiment of the present invention will be described with reference to drawings. A component mounting device 1 for manufacturing a liquid crystal panel substrate that is illustrated in FIG. 1 executes a component installation operation for installing components 4 on substrates 2 by attaching an ACF tape 3 as an adhesion member to an electrode section 2a, which is disposed in an end portion of one of four sides of the rectangular panel-shaped substrate 2 illustrated in FIG. 2, loading (provisionally crimping) the component 4 on the attached ACF tape 3, and then performing crimping (main crimping). The component 4 that is used herein is, for example, a drive circuit component and has a film-shaped part 4a.

In FIG. 1, a left base 11a, a central base 11b, and a right base 11c are arranged in this order in a base 11 of the component mounting device 1 from the left in a left-right direction viewed by an operator OP (left-right direction in FIG. 1, referred to as an X-axis direction). The left base 11a is provided with a carried substrate placement section 21, the central base 11b is provided with a component mounting execution unit 22, and the right base 11c is provided with an unloaded substrate placement section 23. Operations of the carried substrate placement section 21, the component mounting execution unit 22, and the unloaded substrate placement section 23 are controlled by a control device 24 (FIG. 3) as a control unit. The substrate 2 flows from the left side to the right side in the X-axis direction, that is in the order of the carried substrate placement section 21, the component mounting execution unit 22, and the unloaded substrate placement section 23, so that a sequential operation is performed.

In FIG. 1, the carried substrate placement section 21 has two substrate placement stages 21s on the left side (upstream process side) and the right side (downstream process side). The two substrate placement stages 21s are disposed to be elevatable from the left base 11a. The substrate 2, which is sent from the upstream process side of the component mounting device 1, is placed on the two substrate placement stages 21s.

The component mounting execution unit 22 has an ACF attachment operation unit (adhesion member attachment operation unit) 22a that performs an operation for attaching the ACF tape 3 as the adhesion member to the substrate 2, a component loading operation unit 22b that performs an operation for loading the component 4 on the substrate 2, and a first component crimping operation unit 22c and a second component crimping operation unit 22d that crimp the component 4 which is loaded by the component loading operation unit 22b to the substrate 2 where the loading operation for the component 4 is performed by the component loading operation unit 22b.

The ACF attachment operation unit 22a is disposed in a left-portion area of the central base 11b, and the component loading operation unit 22b is disposed in a central area of the central base 11b. The first component crimping operation unit 22c is disposed in an area between the ACF attachment operation unit 22a and the component loading operation unit 22b on the central base 11b, and the second component crimping operation unit 22d is disposed in an area to the right side from the component loading operation unit 22b on the central base 11b. In other words, in the component mounting device 1 according to this embodiment, the first component crimping operation unit 22c and the second component crimping operation unit 22d are disposed at positions that pinch the component loading operation unit 22b from both left and right sides.

A first base portion 31 is disposed in an area in front of the ACF attachment operation unit 22a on the central base 11b (front-back direction viewed by the operator OP being a Y-axis direction). A second base portion 32 is disposed, extending in the X-axis direction, in an area in front of the component loading operation unit 22b, the first component crimping operation unit 22c, and the second component crimping operation unit 22d on the central base 11b.

Figure 4:
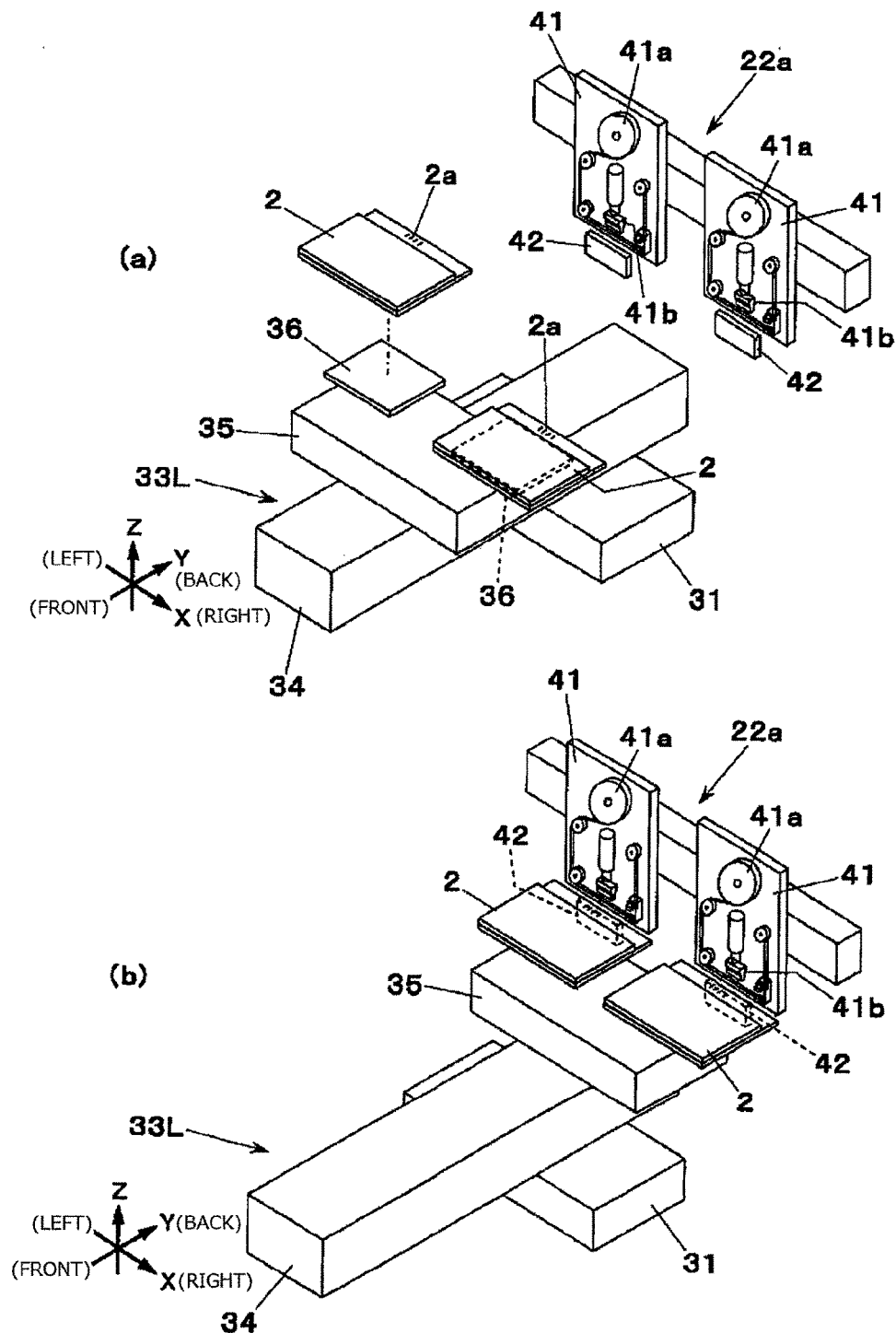
FIGS. 4(a) and 4(b) are perspective views of an ACF attachment operation unit and a left substrate transport unit of the component mounting device according to the embodiment of the present invention.

In FIGS. 1, 4(a), and 4(b), a left substrate transport unit 33L is disposed in the first base portion 31. The left substrate transport unit 33L has a Y-axis table 34 that is disposed to extend in the Y-axis direction on the first base portion 31 and is disposed to be movable in the X-axis direction on the first base portion 31, a moving stage 35 that is disposed to be movable in the Y-axis direction on the Y-axis table 34, and two substrate placement stages 36 that are disposed in parallel in the X-axis direction on an upper surface of the moving stage 35. The two substrates 2 are transferred from the two substrate placement stages 21s of the carried substrate placement section 21 and are held on the two substrate placement stages 36.

Each of the two substrate placement stages 36 is disposed to be elevatable from the moving stage 35. The control device 24 moves the moving stage 35 in the Y-axis direction with respect to the Y-axis table 34 so as to perform transport of the substrate 2, and moves the two substrates 2, which are placed on the two substrate placement stages 36, upward and downward by elevating the two substrate placement stages 36.

In FIGS. 4(a) and 4(b), the ACF attachment operation unit 22a has two attachment heads 41 that are disposed in parallel in the X-axis direction on the central base 11b and two ACF attachment operation backup stages 42 that are disposed to extend in the X-axis direction below the respective attachment heads 41.

Each of the two attachment heads 41 is provided with a tape supply unit 41a that feed-supplies the ACF tape 3, cuts the feed-supplied ACF tape 3 into a predetermined length, and holds the ACF tape 3 in a horizontal posture at a predetermined position, and an attachment tool 41b that presses the ACF tape 3, which is held in the horizontal posture by the tape supply unit 41a, toward the ACF attachment operation backup stages 42 from above.

The control device 24 moves the moving stage 35 of the left substrate transport unit 33L between a "substrate delivery position" (FIG. 4(a)) that is set forward on the Y-axis table 34 and an "operation position" (FIG. 4(b)) that is set backward on the Y-axis table 34. The "substrate delivery position" is a position where delivery of the substrates 2 to the two substrate placement stages 36 can be performed. The "operation position" is a position where the respective electrode sections 2a of the two substrates 2, which are placed on the two substrate placement stages 36, can be positioned on the two ACF attachment operation backup stages 42.

Figure 5:
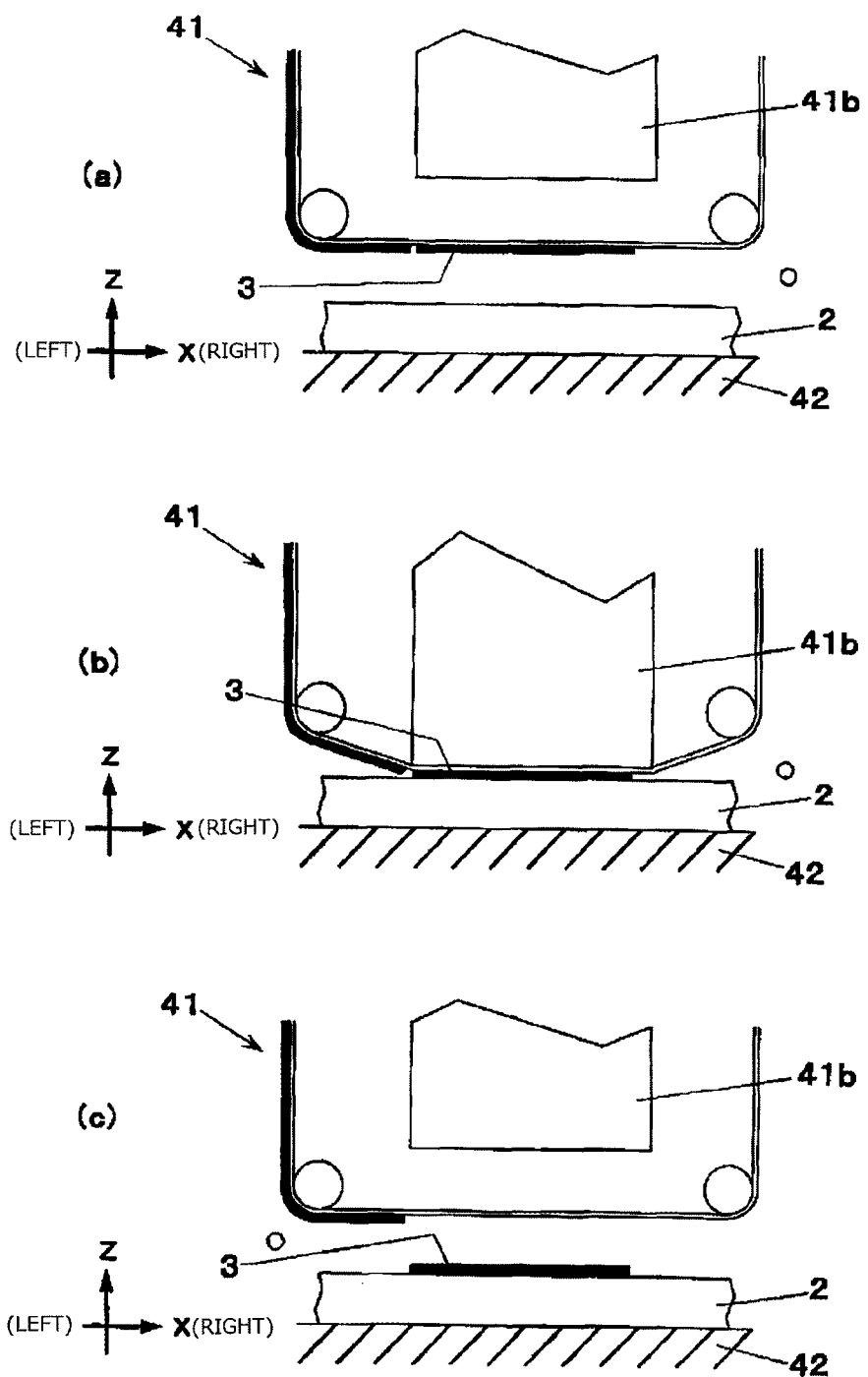
FIGS. 5(a), 5(b), and 5(c) are diagrams illustrating an execution procedure of an ACF tape attachment operation by the ACF attachment operation unit according to the embodiment of the present invention.

An operation for attaching the ACF tape 3 to the substrate 2 with the attachment head 41 will be described with reference to FIGS. 5(a), 5(b), and 5(c). Firstly, as illustrated in FIG. 5(a), the control device 24 operates the tape supply unit 41a so that the ACF tape 3, which is cut into a predetermined length, is positioned above the substrates 2 (electrode sections 2a). Then, as illustrated in FIG. 5(b), the attachment tool 41b is lowered so that the ACF tape 3 is pressed to the ACF attachment operation backup stage 42 for each of the substrates 2. Lastly, as illustrated in FIG. 5(c), the attachment tool 41b is lifted from the substrate 2. As a result, the ACF tape 3 having a predetermined length is attached to the substrates 2.

Figure 6:
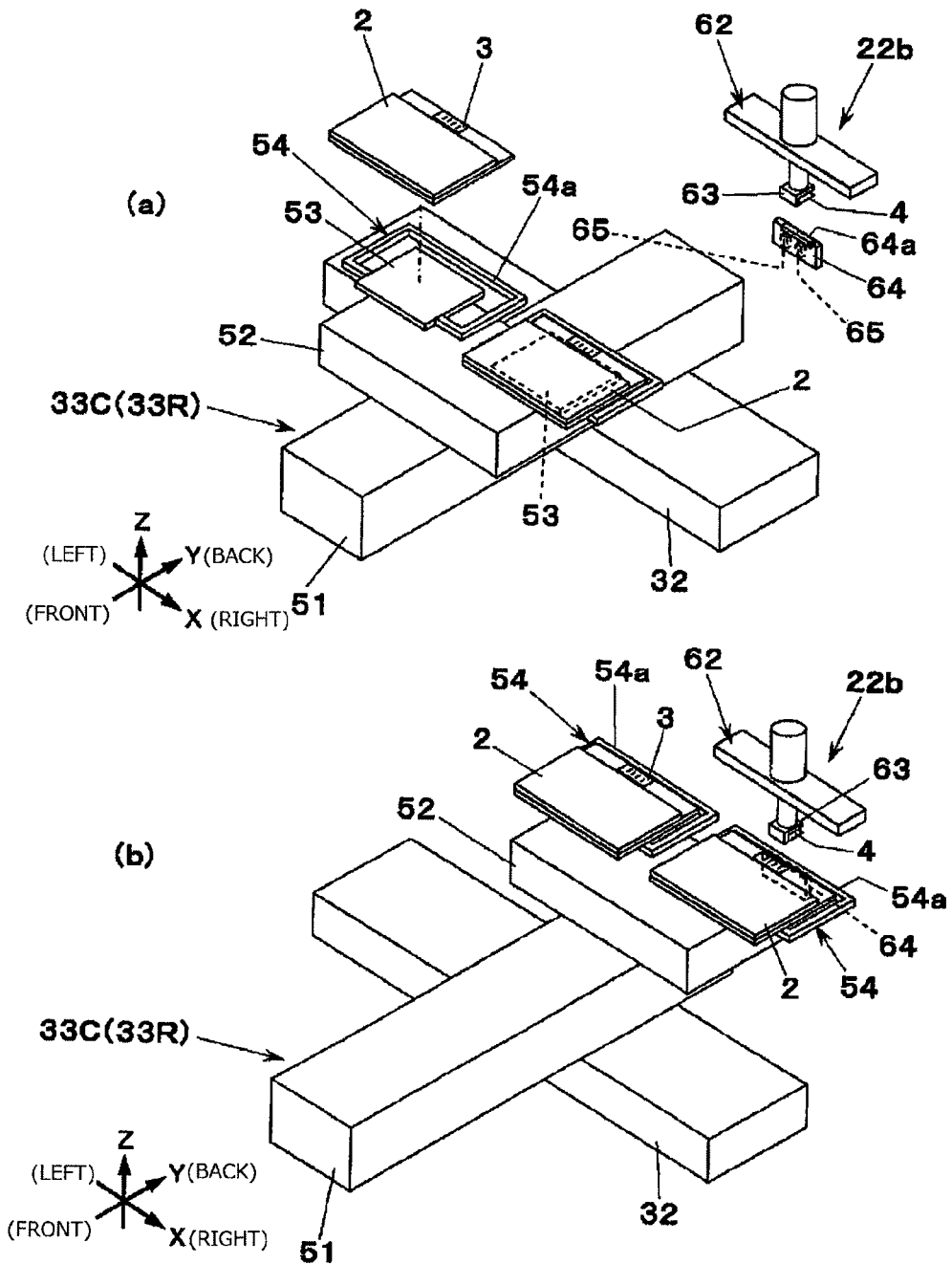
FIGS. 6(a) and 6(b) are perspective views of a component loading operation unit and a central substrate transport unit (right substrate transport unit) of the component mounting device according to the embodiment of the present invention.

In FIG. 1, a central substrate transport unit 33C and a right substrate transport unit 33R are disposed in the second base portion 32. The central substrate transport unit 33C and the right substrate transport unit 33R have the same shape, and the central substrate transport unit 33C is positioned to the left from the right substrate transport unit 33R. The central substrate transport unit 33C (as is the case with the right substrate transport unit 33R) has a Y-axis table 51 that is disposed to be movable in the X-axis direction along the second base portion 32, a moving stage 52 that is disposed to be movable in the Y-axis direction on the Y-axis table 51, and two substrate placement stages 53 that are disposed to be parallel in the X-axis direction on an upper surface of the moving stage 52 as illustrated in FIGS. 6(a) and 6(b). The two substrate placement stages 53 are movable in a horizontal direction because of an X-axis-direction movement of the Y-axis table 51 with respect to the second base portion 32 and a movement of the moving stage 52 with respect to the Y-axis table 51. The two substrates 2 are transferred from the left substrate transport unit 33L onto the two substrate placement stages 53.

Each of the two substrate placement stages 53 is disposed to be elevatable from the moving stage 52. The control device 24 perform the transport of the substrate 2 by performing the X-axis-direction movement of the Y-axis table 51 with respect to the second base portion 32 and a Y-axis-direction movement of the moving stage 52 with respect to the Y-axis table 51 and moving the two substrate placement stages 53 in a horizontal in-plane direction. The control device 24 also moves upwardly or downwardly the two substrate placement stages 53 (FIG. 3), moves the two substrates 2, which are placed on the two substrate placement stages 53, upward and downward, and allows the two substrates 2 to land on/be separated from an upper surface of a backup stage 64.

Figure 3:
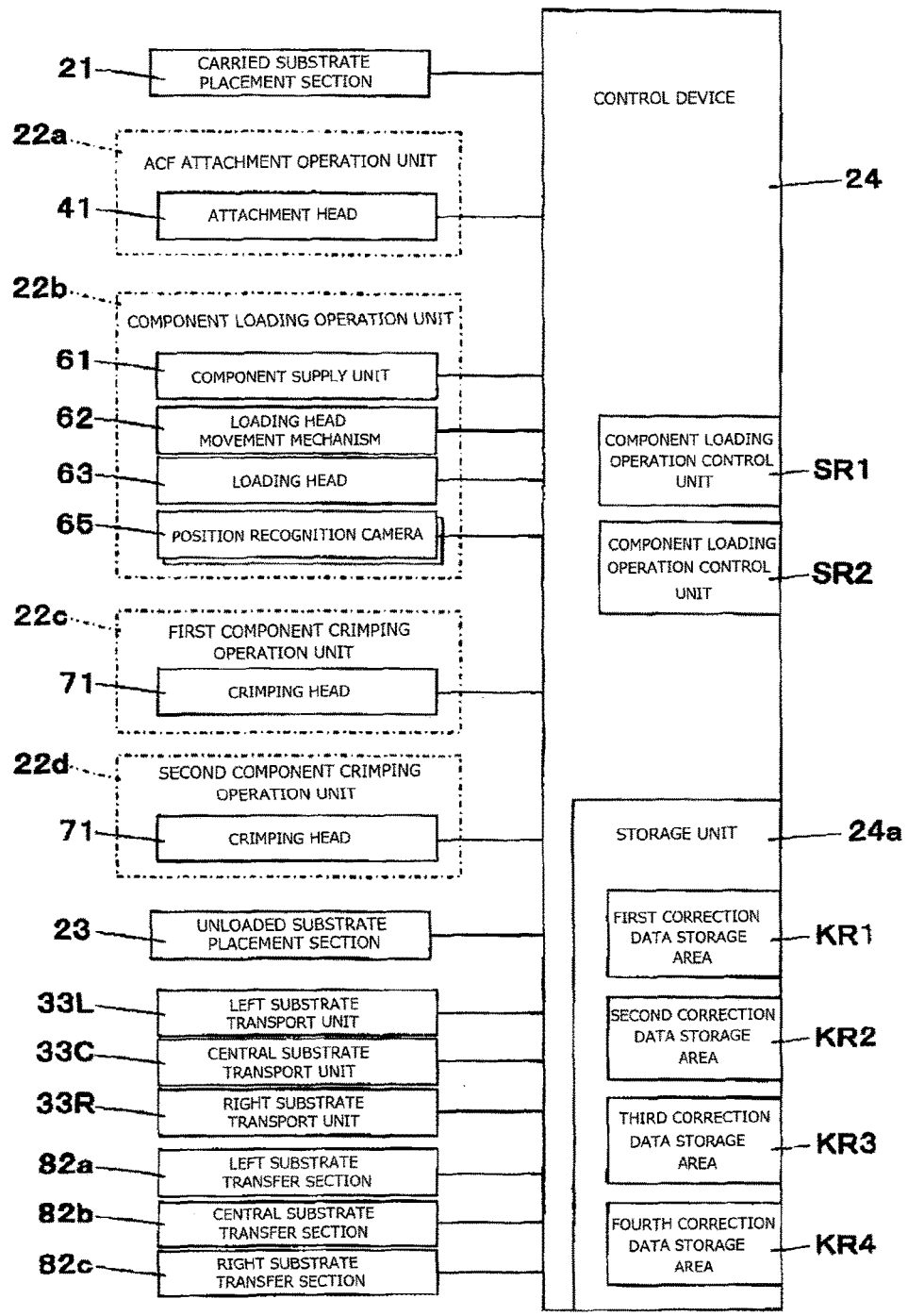
FIG. 3 is a block diagram illustrating a control system of the component mounting device according to the embodiment of the present invention.

In FIGS. 1, 6(a), and 6(b), the component loading operation unit 22b is provided with a component supply unit 61 that is disposed to overhang backward from a back portion of the central base 11b and performs supply of the component 4, a loading head 63 that can be moved within a horizontal plane by a loading head movement mechanism 62 which is disposed in a central back portion of the central base 11b and adsorbs the component 4 which is supplied by the component supply unit 61 from above, and the component loading operation backup stage 64 that is disposed to extend in the Y-axis direction in an area behind a central portion of the second base portion 32. The control device 24 controls supply operation control for the component 4 by the component supply unit 61, a movement operation of the loading head 63 within the horizontal plane by an operation of the loading head movement mechanism 62, and an adsorption operation for the component 4 by the loading head 63. A series of operations from the adsorption (pickup) of the component 4 by the loading head 63 to loading of the component 4 on the substrate 2 are performed in this manner (FIG. 3).

In FIG. 6(a), two position recognition cameras 65 having upward imaging fields are disposed in parallel in the X-axis direction in the component loading operation backup stage 64. The control device 24 controls the two position recognition cameras 65 to perform an imaging operation. The two position recognition cameras 65 image an object that is positioned above the component operation loading backup stage 64 through a transparent material section 64a (FIG. 6(a)) such as quartz glass which is disposed in an upper portion of the component loading backup stage 64.

The control device 24 moves the moving stage 52 of the central substrate transport unit 33C between a "substrate delivery position" (FIG. 6(a)) that is set forward on the Y-axis table 51 and an "operation position" (FIG. 6(b)) that is set backward on the Y-axis table 51. The "substrate delivery position" is a position where delivery of the substrates 2 to the two substrate placement stages 53 can be performed. The "operation position" is a position where the ACF tape 3, which is attached to the electrode section 2a of one of the substrates 2 placed on the two substrate placement stages 53, can be positioned above the component loading operation backup stage 64 (and above component crimping operation backup stages 72 (described later)).

Figure 7:
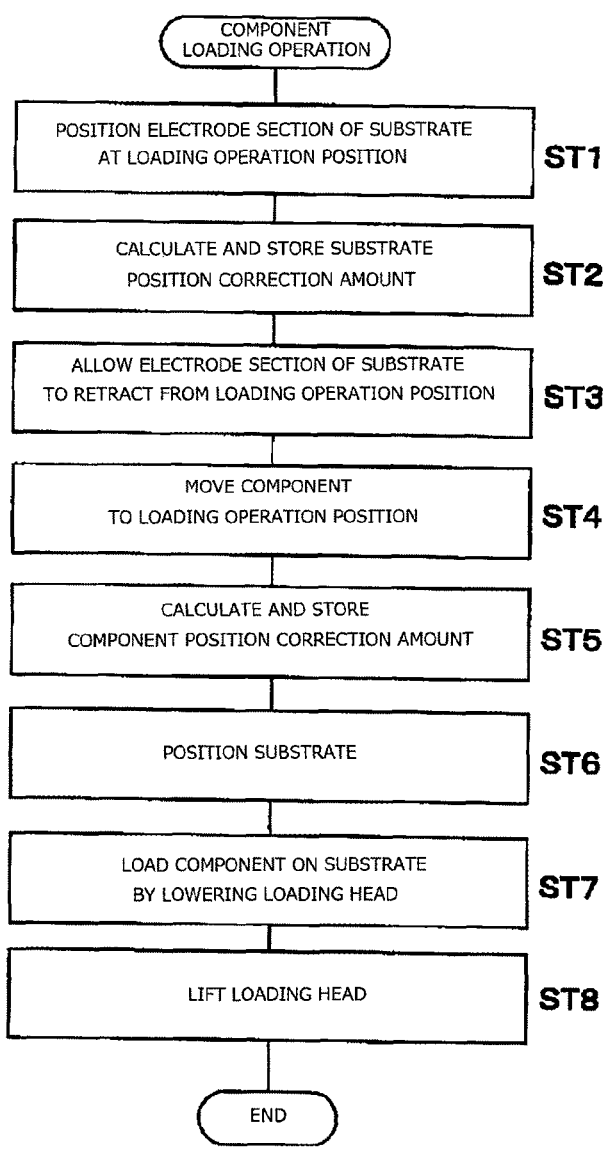
FIG. 7 is a flowchart illustrating an execution procedure of a component loading operation by the component loading operation unit according to the embodiment of the present invention.
Figure 8:
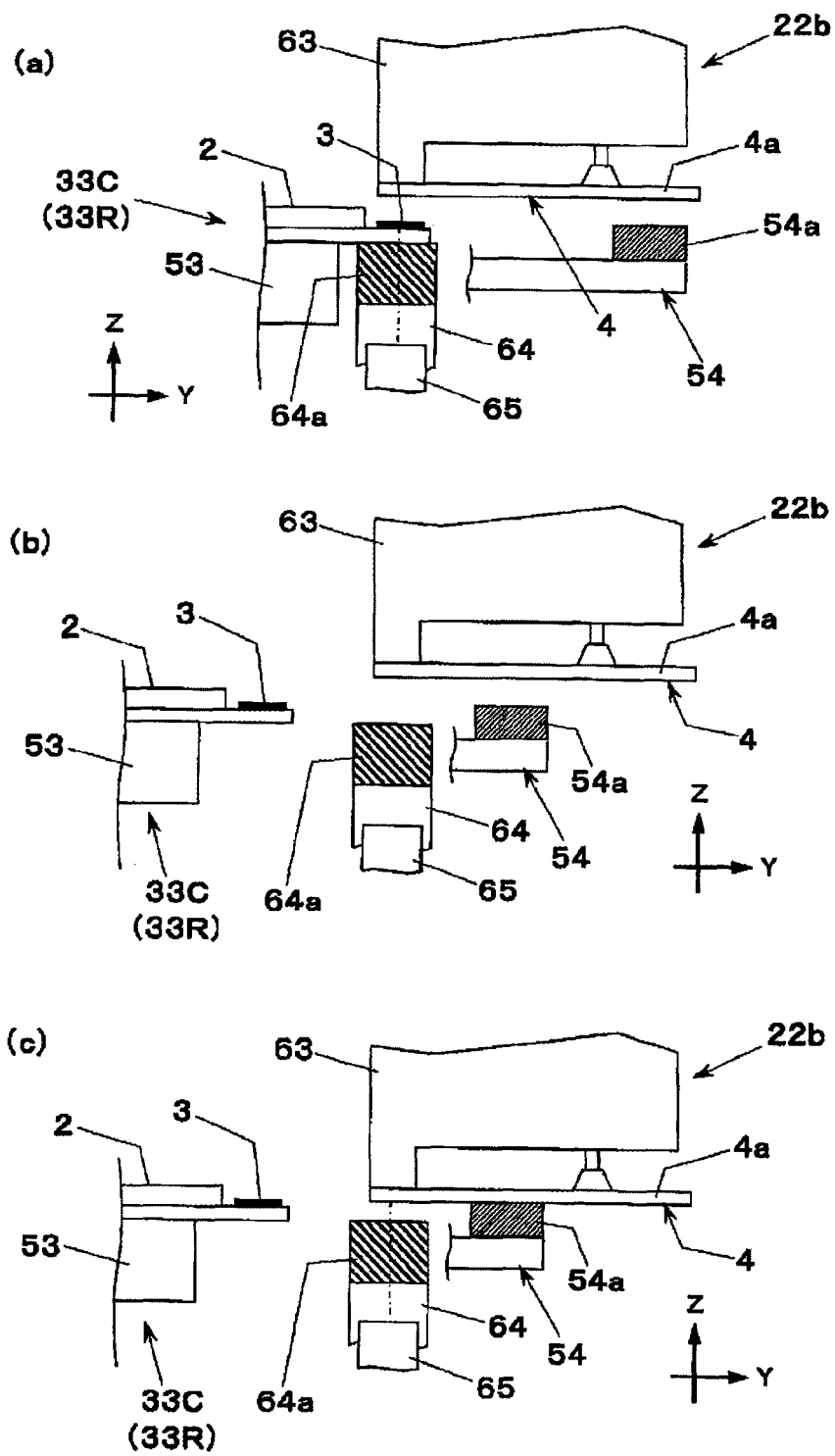
FIGS. 8(a), 8(b), and 8(c) are diagrams illustrating the execution procedure of the component loading operation by the component loading operation unit according to the embodiment of the present invention.

In a case where the component 4 is loaded on the substrate 2, the control device 24 first moves the moving stage 52 to the "operation position" so that the electrode section 2a of the substrate 2 is positioned at an upper position (loading operation position) of the backup stage 64 (Step ST1 illustrated in the flowchart in FIG. 7). Then, the two position recognition cameras 65 are allowed to image and recognize two position recognition marks m (FIG. 2) of the substrate 2 that is positioned above the component loading backup stage 64 (FIG. 8(a)). Information relating to the position of the substrate 2 (information on the position of the substrate 2 with respect to the substrate placement stage 53) is calculated (acquired) based on position information of the two position recognition marks m, and the result is stored in a storage unit 24a (FIG. 3) of the control device 24 (Step ST2, information acquisition process).

Specifically, position correction amount data for the substrate 2 which is held on the substrate placement stage 53 on the left side of the central substrate transport unit 33C with respect to the substrate placement stage 53 is stored in a first correction data storage area KR1 of the storage unit 24a as information relating to the position of the substrate 2. Likewise, position correction amount data for the substrate 2 which is held on the substrate placement stage 53 on the right side of the central substrate transport unit 33C is stored in a second correction data storage area KR2. Position correction amount data for the substrate 2 which is held on the substrate placement stage 53 on the left side of the right substrate transport unit 33R with respect to the substrate placement stage 53 is stored in a third correction amount data storage area KR3, and position correction amount data for the substrate 2 which is held on the substrate placement stage 53 on the right side is stored in a fourth correction data storage area KR4.

When the information acquisition process finishes, the control device 24 (component loading operation control unit SR1) moves the moving stage 52 forward and allows the electrode section 2a of the substrate 2 to retract from the upper position (loading operation position) of the backup stage 64 (FIG. 8(b), Step ST3). Then, the loading head 63 is lowered and the component 4 is moved to be closer toward the backup stage 64 (position recognition cameras 65 side) (to the loading operation position) (Step ST4). Then, the two position recognition cameras 65 image and recognize a position recognition mark (not illustrated) of the component 4 (FIG. 8(c)), and calculate (acquire) information relating to the position of the component 4 (information on the position of the component 4 with respect to the loading head 63). Then, a position correction amount for the component 4 is obtained, and the result is stored in the storage unit 24a (Step ST5).

Figure 9:
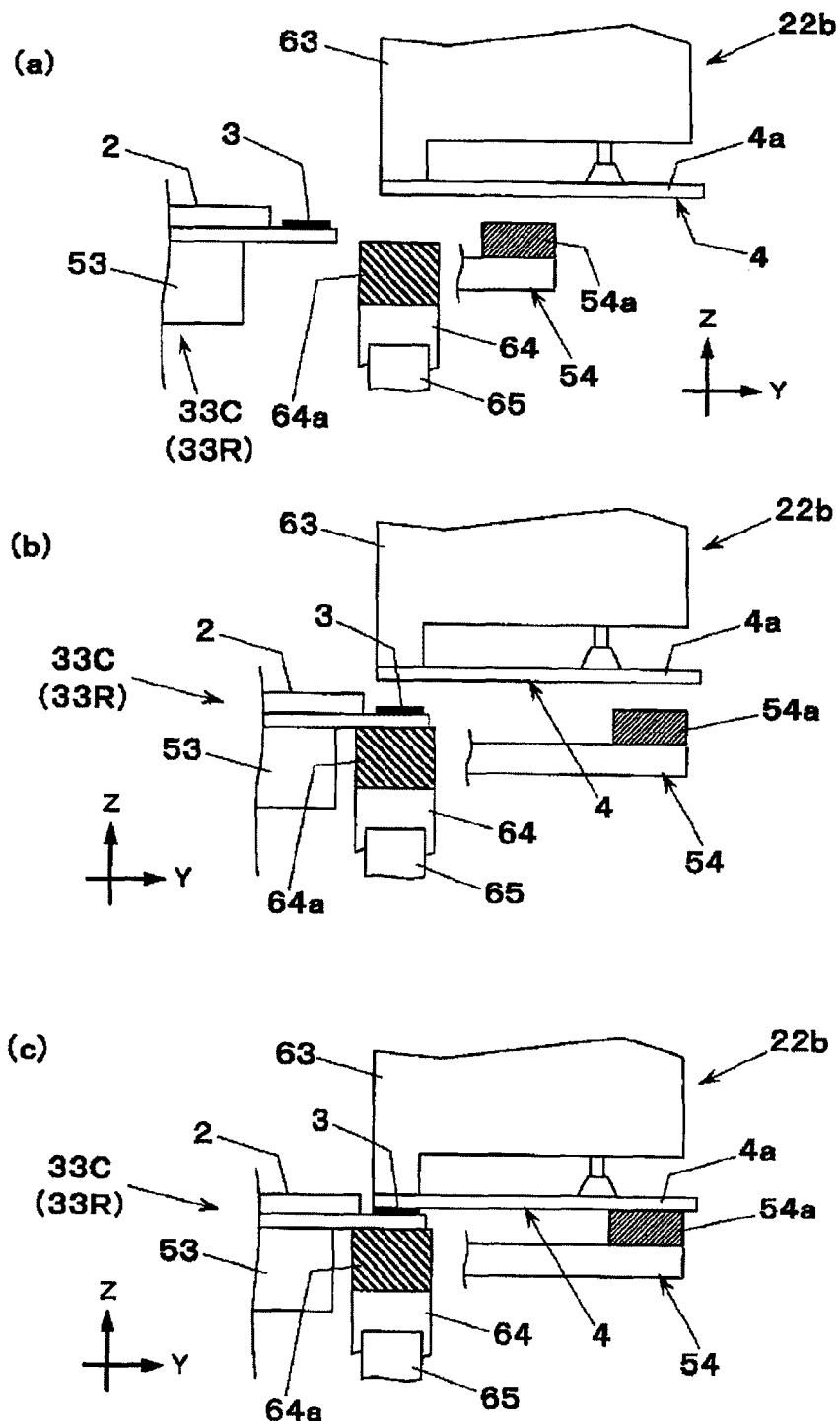
FIGS. 9(a), 9(b), and 9(c) are diagrams illustrating the execution procedure of the component loading operation by the component loading operation unit according to the embodiment of the present invention.

After the position information of the substrate 2 and the position information of the component 4 are stored in the storage unit 24a as described above, the control device 24 (component loading operation control unit SR1) lifts the loading head 63 (FIG. 9(a)) and positions the moving stage 52 back at the "operation position". Then, operation control for the central substrate transport unit 33C is performed based on the information relating to the position of the substrate 2 (position correction amount for the substrate 2) and the information relating to the position of the component 4 (position correction amount for the component 4) which are stored in the storage unit 24a so that an electrode section (not illustrated) on the component 4 side and the electrode section 2a on the substrate 2 side match in an up-down direction, and positioning of the substrate 2 is performed with respect to the component loading operation unit 22b (directly, with respect to the component 4) (FIG. 9(b), first substrate positioning process, Step ST6).

As described above, the position recognition camera 65 of the component loading operation unit 22b of the component mounting device 1 according to this embodiment is a position recognition unit that performs the recognition of the position of the substrate 2 on the substrate placement stage 53 of the central substrate transport unit 33C or the recognition of the position of the substrate 2 on the substrate placement stage 53 of the right substrate transport unit 33R before performing the operation for loading the component 4 on the substrate 2 which is transported by the central substrate transport unit 33C or the substrate 2 which is transported by the right substrate transport unit 33R.

After the positioning of the substrate 2 with respect to the component loading operation unit 22b is performed as described above, the control device 24 (component loading operation control unit SR1) lowers the loading head 63, presses the component 4 which is adsorbed by the loading head 63 to the ACF tape 3 on the substrate 2, and loads the substrate 2 (FIG. 9(c), component loading process, Step ST7). In this case, a pressing force of the loading head 63 is supported by the component loading backup stage 64. After the component 4 is loaded on the substrate 2, the control device 24 lifts the loading head 63 (Step ST8).

Figure 2:
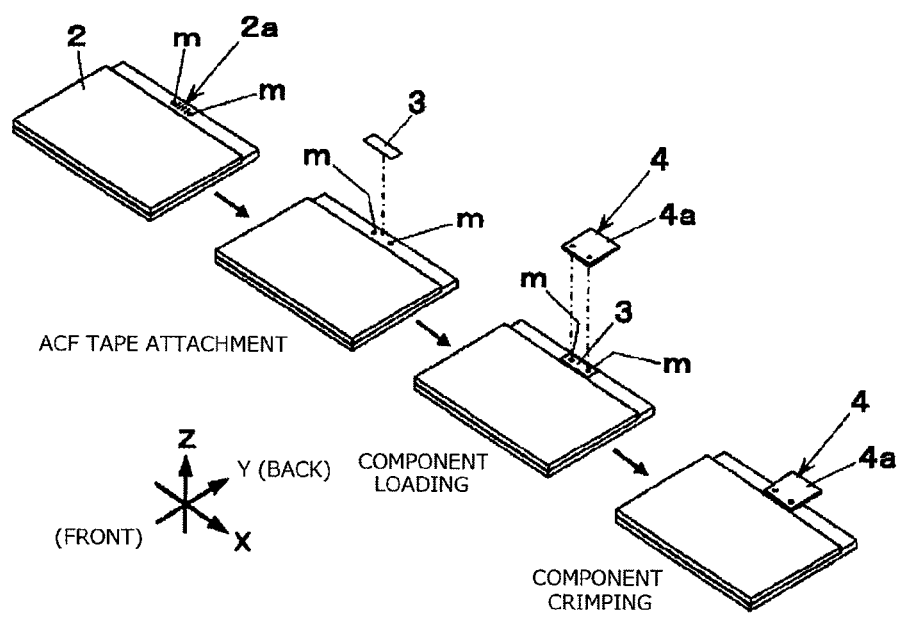
FIG. 2 is a diagram illustrating a progress procedure of a component installation operation on a substrate with the component mounting device according to the embodiment of the present invention.

As illustrated in FIGS. 6(a), 6(b) to 8(a), 8(b), 8(c), 9(a), 9(b), and 9(c), a frame-shaped film-shaped part supporting section 54 that has a horizontal portion 54a which extends in the X-axis direction behind the substrate placement stage 53 is disposed on each of the two substrate placement stages 53 of the central substrate transport unit 33C (as is the case with the right substrate transport unit 33R). As illustrated in FIG. 2 and the like, the film-shaped part 4a of the component 4, which is loaded on the substrate 2 by the component loading operation unit 22b, protrudes from the substrate 2 in a state where the component 4 is loaded on the substrate 2. However, the film-shaped part 4a of the component 4 that protrudes from the substrate 2 in a state where the component 4 is loaded on the substrate 2 is supported from below by the horizontal portion 54a of the film-shaped part supporting section 54 since the film-shaped part supporting sections 54 are disposed in the respective substrate placement stages 53. Accordingly, a state where the film-shaped part 4a of the component 4 in a state of being loaded on the substrate 2 sags downward can be prevented.

Figure 10:
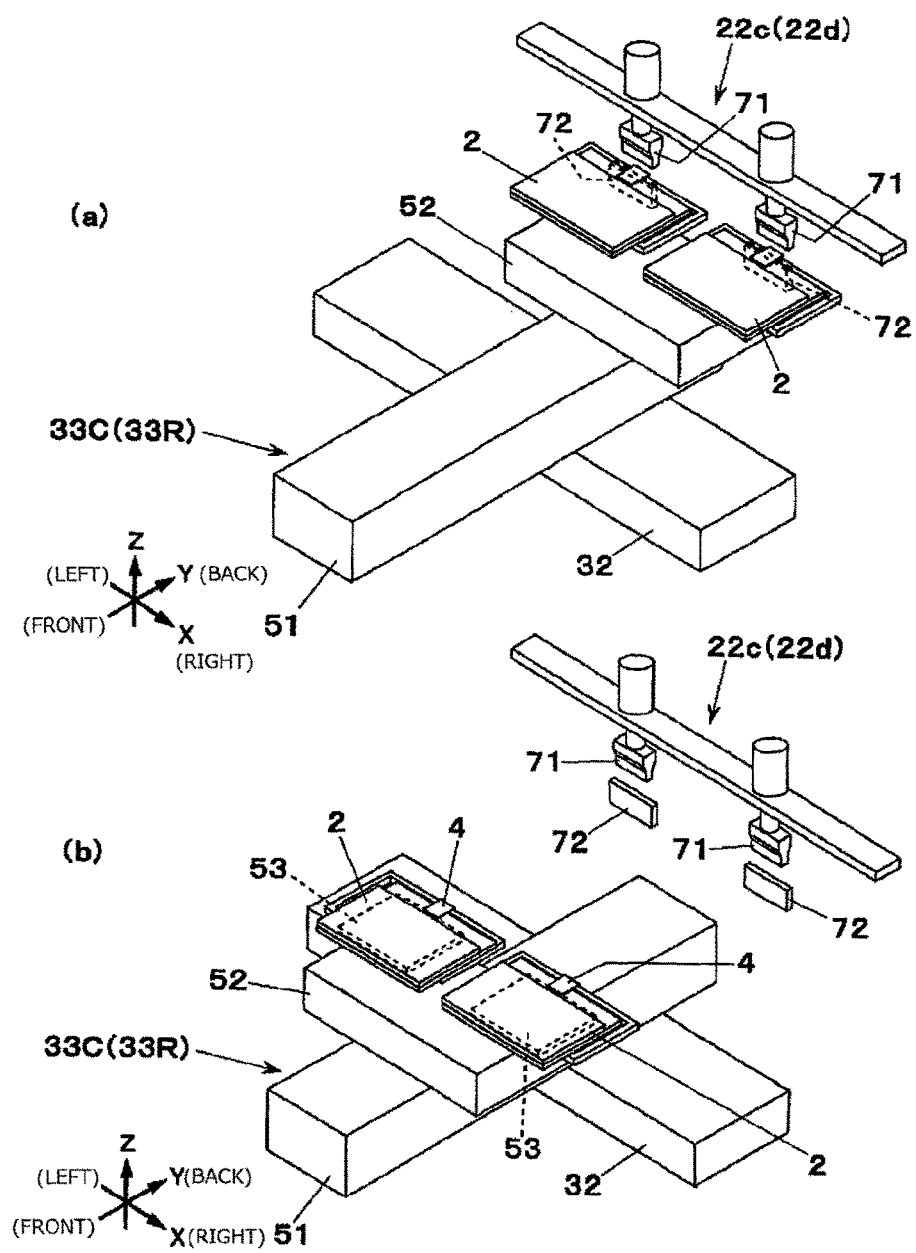
FIGS. 10(a) and 10(b) are perspective views of a first component crimping operation unit (second component crimping operation unit) and the left substrate transport unit (right substrate transport unit) of the component mounting device according to the embodiment of the present invention.

As illustrated in FIGS. 10(a) and 10(b), the first component crimping operation unit 22c (as is the case with the second component crimping operation unit 22d) is provided with two crimping heads 71 that are disposed in parallel in the X-axis direction and the two component crimping operation backup stages 72 that are disposed to extend in the Y-axis direction below the respective crimping heads 71. A component crimping operation control unit SR2 (FIG. 3) of the control device 24 controls an elevation operation for each of the crimping head 71 of the first component crimping operation unit 22c and the crimping head 71 of the second component crimping operation unit 22d (FIG. 3).

Figure 11:
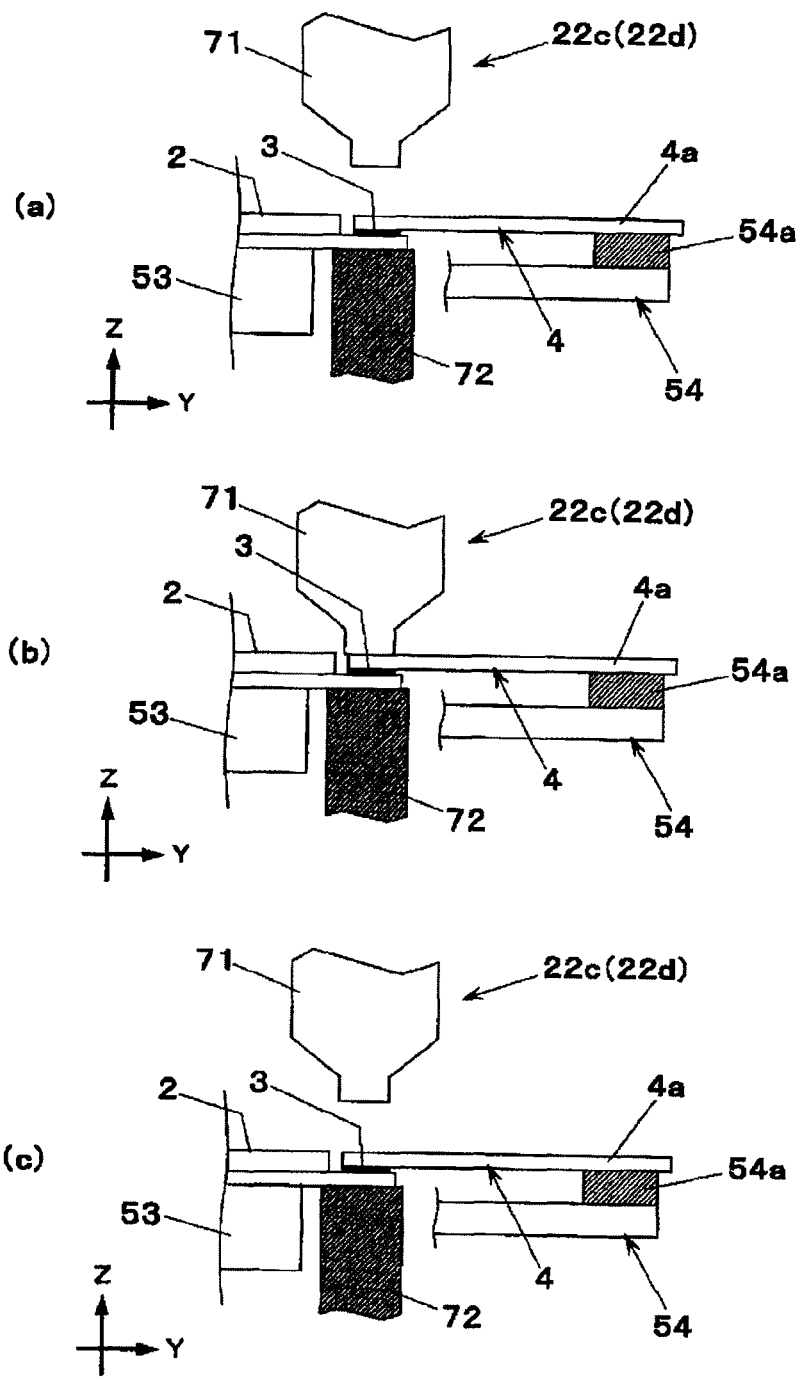
FIGS. 11(a), 11(b), and 11(c) are diagrams illustrating an execution procedure of a component crimping operation by the first component crimping operation unit (second component crimping operation unit) according to the embodiment of the present invention.

When the operation for loading the components 4 by the loading head 63 is terminated on the two substrates 2 that are placed on the two substrate placement stages 53 of the central substrate transport unit 33C, the control device 24 (component crimping operation control unit SR2) moves the Y-axis table 51 leftward (that is, in the horizontal direction to the first component crimping operation unit 22c side) along the second base portion 32 as it is, and positions the respective parts of the two substrates 2 placed on the two substrate placement stages 53 to which the ACF tape 3 is attached above the two component crimping operation backup stages 72 (below the two crimping heads 71) (FIG. 10(a)). In this case, the substrate placement stage 53 is moved based on the information relating to the position of the substrate 2 stored in the storage unit 24a, and the substrate 2 is positioned with respect to the first component crimping operation unit 22c (FIG. 10(a), second substrate positioning process). Specifically, the positioning for the substrate 2 that is held by the substrate placement stage 53 on the left side is performed by using the position correction amount data which is read from the first correction data storage area KR1, and the positioning for the substrate 2 that is held by the substrate placement stage 53 on the right side is performed by using the position correction amount data which is read from the second correction data storage area KR2. Then, the two crimping heads 71 of the first component crimping operation unit 22c are lowered in sequence, and the components 4 loaded by the component loading operation unit 22b are crimped on the two substrates 2 (FIG. 11(a) to FIG. 11(b) to FIG. 11(c), component crimping operation process).

Likewise, when the operation for loading the components 4 by the loading head 63 is terminated on the two substrates 2 that are placed on the two substrate placement stages 53 of the right substrate transport unit 33R, the control device 24 (component crimping operation control unit SR2) moves the Y-axis table 51 rightward (that is, to the second component crimping operation unit 22d side) along the second base portion 32 as it is, and positions the respective parts of the two substrates 2 placed on the two substrate placement stages 53 where the components 4 are loaded above the two component crimping operation backup stages 72 (below the two crimping heads 71) (FIG. 10(a)). Then, the substrate placement stage 53 is moved based on the information relating to the position of the substrate 2 acquired from the information acquisition process described above, and the substrate 2 is positioned with respect to the second component crimping operation unit 22d (FIG. 10(a), second substrate positioning process). Specifically, the positioning for the substrate 2 that is held by the substrate placement stage 53 on the left side is performed by using the position correction amount data which is read from the third correction data storage area KR3, and the positioning for the substrate 2 that is held by the substrate placement stage 53 on the right side is performed by using the position correction amount data which is read from the fourth correction data storage area KR4. Then, the two crimping heads 71 of the second component crimping operation unit 22d are lowered in sequence, and the components 4 loaded by the component loading operation unit 22b are crimped on the two substrates 2 (FIG. 11(a) to FIG. 11(b) to FIG. 11(c), component crimping operation process).

In the crimping operation for the components 4 by the two crimping heads 71 of each of the first component crimping operation unit 22c and the second component crimping operation unit 22d, the two substrate placement stages 53 where the two substrates 2 are placed are attached to the one moving stage 52. Accordingly, positioning with respect to the crimping heads 71 corresponding to the respective substrates 2 (and the subsequent component crimping operation) are performed in sequence at different timings. This operation will be described in detail with reference to FIGS. 12 and 13(a) to 13F.

Figure 12:
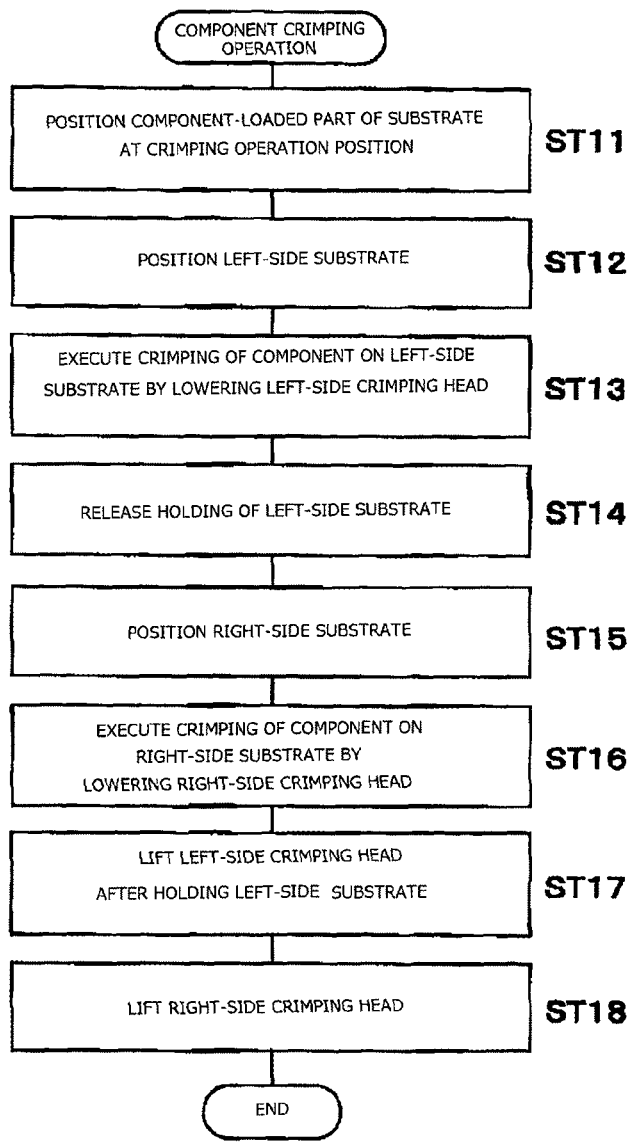
FIG. 12 is a flowchart illustrating a procedure of the component crimping operation that is executed by the component mounting device according to the embodiment of the present invention.

The control device 24 (component crimping operation control unit SR2) positions each of the parts of the two substrates 2 placed on the two substrate placement stages 53 where the components 4 are loaded above the backup stage 72 (Step ST11 illustrated in the flowchart in FIG. 12). In this case, the moving stage 52 is moved based on the information relating to the position of the substrate 2 (position correction amount data for the substrate 2 held by the substrate placement stage 53 on the left side) which is acquired in the component loading operation described above and is stored in the first correction data storage area KR1 (or the third correction data storage area KR3) of the storage unit 24a. In this manner, one of the substrates 2 (on the left side herein) is positioned with respect to the corresponding crimping head 71 (FIG. 13(a), Step ST12). Then, the crimping head 71 on the left side is lowered in this state, the substrate 2 is clamped between the backup stage 72 and the crimping head 71, and the component 4 is crimped with respect to the substrate 2 on the left side (FIG. 13(b), Step ST13). Then, the substrate placement stage 53 on the left side is slightly lowered with the clamping state maintained, and a state where the substrate 2 is supported by the substrate placement stage 53 is released (FIG. 13(c), Step ST14).

Figure 13:
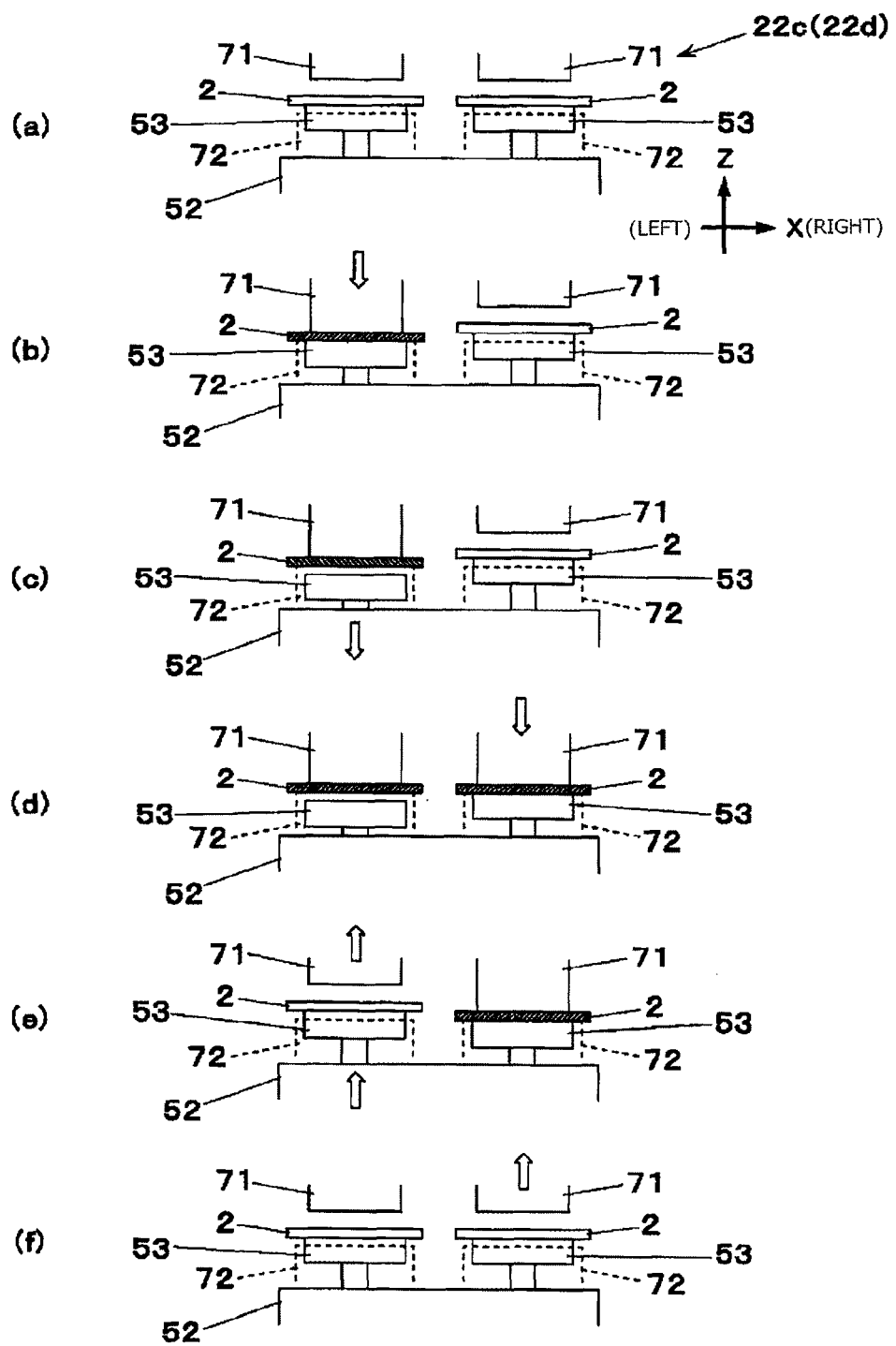
FIGS. 13(a) to 13F are diagrams illustrating the execution procedure of the component crimping operation by the first component crimping operation unit (second component crimping operation unit) according to the embodiment of the present invention.

After the moving stage 52 is allowed to be moved independently of the substrate 2 on the left side as described above, the moving stage 52 is moved in the same manner based on the information relating to the position of the substrate 2 (position correction amount data for the substrate 2 held by the substrate placement stage 53 on the right side) which is acquired in the component loading operation described above and is stored in the second correction data storage area KR2 (or the fourth correction data storage area KR4) of the storage unit 24a. In this manner, the other one of the substrates 2 (on the right side herein) is positioned with respect to the corresponding crimping head 71 (Step ST15). Then, the crimping head 71 on the right side is lowered in this state, the substrate 2 is clamped between the backup stage 72 and the crimping head 71, and the component 4 is crimped with respect to the substrate 2 on the right side (FIG. 13D, Step ST16). After the component 4 is crimped with respect to the substrate 2 on the right side, the control device 24 (component crimping operation control unit SR2) lifts the substrate placement stage 53 on the left side, supports the substrate 2, lifts the crimping head 71 on the left side (FIG. 13E, Step ST17), and then lifts the crimping head 71 on the right side (FIG. 13F, Step ST18). In this manner, the operation for crimping the components 4 with respect to the two substrates 2 is completed.

After the components 4 are crimped with respect to the two substrates 2 through the above-described procedure, the control device 24 (component crimping operation control unit SR2) moves the moving stage 52 forward along the Y-axis table 51 and returns the moving stage 52 to the "substrate delivery position".

As described above, the component mounting device 1 according to this embodiment is provided with the component loading operation unit 22b that performs the operation for loading the component 4 on the substrate 2, the first component crimping operation unit 22c and the second component crimping operation unit 22d that crimp the component 4 which is loaded by the component loading operation unit 22b on the substrate 2 where the operation for loading the component 4 is performed by the component loading operation unit 22b, the substrate placement stage 53 that holds the substrate 2 and is disposed to be movable between the component loading operation unit 22b and the first component crimping operation unit 22c or between the component loading operation unit 22b and the second component crimping operation unit 22d, and the control device as a stage movement control unit that performs the positioning of the substrate 2 with respect to the component loading operation unit 22b by moving the substrate placement stage 53 to the component loading operation unit 22b and performs the positioning of the substrate 2 with respect to the first component crimping operation unit 22c or the second component crimping operation unit 22d by moving the substrate placement stage 53 to the first component crimping operation unit 22c or the second component crimping operation unit 22d after the operation for loading the component 4 on the substrate 2 is performed by the component loading operation unit 22b.

The control device 24 functions also as an information acquisition unit that acquires the information relating to the position of the substrate 2 by recognizing the substrate 2 which is placed on the substrate placement stage 53 by using the recognition unit. The control device 24 as the stage movement control unit moves the substrate placement stage 53 based on the information (information relating to the position of the substrate 2) which the control device 24 as the information acquisition unit acquires, and performs the positioning of the substrate 2 with respect to the component loading operation unit 22b and the positioning of the substrate 2 with respect to the first component crimping operation unit 22c or the second component crimping operation unit 22d.

The positioning of the crimping heads 71 with respect to the substrates 2 that are placed on the two substrate placement stages 53 and the crimping of the components 4 by the crimping heads 71 may not only be performed individually with respect to the two right and left substrates 2 as described above but also be performed at the same time. In this case, an average value of positional misalignment of the substrate 2 on the left side with respect to the substrate placement stage 53 on the left side and positional misalignment of the substrate 2 on the right side with respect to the substrate placement stage 53 on the right side acquired in the component loading operation is calculated, and the substrate placement stages 53 on the left side and the right side are positioned at the same time with respect to the respectively corresponding crimping heads 71. Then, the components 4 are crimped at the same time on the substrates 2 by the crimping heads 71. In this case, cycle time can be shortened compared to individual positioning although positioning accuracy slightly decreases.

In FIG. 1, the unloaded substrate placement section 23 has two substrate placement stages 23s, one on the left side (upstream process side) and the other on the right side (downstream process side). These two right and left substrate placement stages 23s are disposed to be elevatable from the right base 11c, and the two substrates 2 are placed on the two substrate placement stages 23s after the crimping operation for the component 4 by the first component crimping operation unit 22c or the second component crimping operation unit 22d is terminated. The two substrates 2 that are placed on the two substrate placement stages 23s are sent to another device that is disposed on the downstream process lower side from the component mounting device 1 by a substrate unloading unit (not illustrated).

In FIG. 1, a moving base 81 that extends in the X-axis direction across the left base 11a, the central base 11b, and the right base 11c is disposed in a front area of the base 11. Three substrate transfer sections 82—a left substrate transfer section 82a, a central substrate transfer section 82b, and a right substrate transfer section 82c in order from the left—are disposed on the moving base 81.

Figure 14:
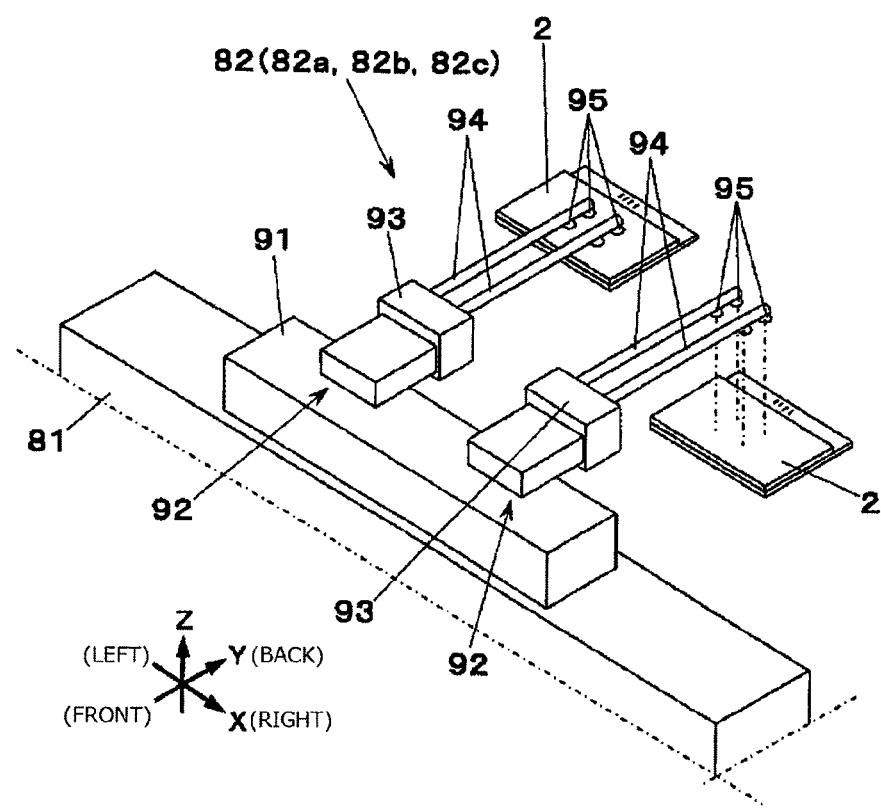
FIG. 14 is a perspective view of a substrate transfer section according to the embodiment of the present invention.

As illustrated in FIG. 14, each of the substrate transfer sections 82 has a base section 91 that is disposed to be movable in the X-axis direction with respect to the moving base 81 and two arm units 92 that are disposed on the base section 91. Each of the arm units 92 is provided with an arm base 93 that is fixed to the base section 91 and two arms 94 that are disposed to extend horizontally backward from the arm base 93. A plurality of adsorption pads with downward adsorption surfaces 95 are disposed in each of the arms 94. Each of the arm units 92 can vacuum-adsorb the one substrate 2 via the four adsorption pads 95 in total which are disposed in the two arms 94.

When the arm units 92 receive the substrate 2 on the substrate placement stage 21s of the carried substrate placement section 21, the control device 24 moves upwardly or downwardly the substrate placement stage 21s in a state where the adsorption pads 95 of the two arms 94 are positioned above the substrate 2. When the substrate 2 on the substrate placement stage 36 of the left substrate transport unit 33L is received by the arm units 92 or the substrate 2 that is adsorbed by the arm units 92 is placed on the substrate placement stage 36, the control device 24 moves upwardly or downwardly the substrate placement stage 36 in a state where the adsorption pads 95 of the two arms 94 are positioned above the substrate 2. When the substrate 2 on the substrate placement stage 53 of the central substrate transport unit 33C or the right substrate transport unit 33R is received by the arm units 92 or the substrate 2 that is adsorbed by the arm units 92 is placed on the substrate placement stage 53, the control device 24 moves upwardly or downwardly the substrate placement stage 53 in a state where the adsorption pads 95 of the two arms 94 are positioned above the substrate 2.

The control device 24 controls an X-axis direction movement operation of each of the left substrate transfer section 82a, the central substrate transfer section 82b, and the right substrate transfer section 82c along the moving base 81 and an adsorption operation for the substrate 2 of each of the arm units 92 via the adsorption pad 95 (FIG. 3). Specifically, the control device 24 operates the left substrate transfer section 82a to transport the substrate 2 from the carried substrate placement section 21 to the left substrate transport unit 33L and operates the central substrate transfer section 82b to transport the substrate 2 from the left substrate transport unit 33L to the central substrate transport unit 33C or the right substrate transport unit 33R. In other words, the control device 24 places the substrates 2, to which the ACF tape 3 is attached by the ACF attachment operation unit 22a, on the two substrate placement stages 53 of the central substrate transport unit 33C and the two substrate placement stages 53 of the right substrate transport unit 33R through sorting. In addition, the control device 24 operates the right substrate transfer section 82c to transport the substrate 2 from the central substrate transport unit 33C or the right substrate transport unit 33R to the unloaded substrate placement section 23.

As described above, a component mounting operation (component mounting method) by the component mounting device 1 according to this embodiment includes the process for acquiring the information relating to the position of the substrate 2 by recognizing the substrate 2 that is held by the substrate placement stage 53 (information acquisition process described above), the process for performing the positioning of the substrate 2 with respect to the component loading operation unit 22b by moving the substrate placement stage 53 based on the information relating to the position of the substrate 2 that is acquired in the information acquisition process (first substrate positioning process described above), the process for executing the operation for loading the component 4 on the substrate 2 where the positioning with respect to the component loading operation unit 22*b* is performed by the component loading operation unit 22*b* (component loading operation process described above), the process for performing the positioning of the substrate 2 with respect to the first component crimping operation unit 22*c* or the second component crimping operation unit 22*d* by moving the substrate placement stage 53 to the first component crimping operation unit 22*c* or the second component crimping operation unit 22*d* after the component loading operation process and moving the substrate placement stage 53 based on the information relating to the position of the substrate 2 which is acquired in the information acquisition process (second substrate positioning process described above), and the process for executing the operation for crimping the component 4 on the substrate 2 where the positioning is performed with respect to the first component crimping operation unit 22*c* or the second component crimping operation unit 22*d* by using the first component crimping operation unit 22*c* or the second component crimping operation unit 22*d* (component crimping operation process described above).

Figure 15:
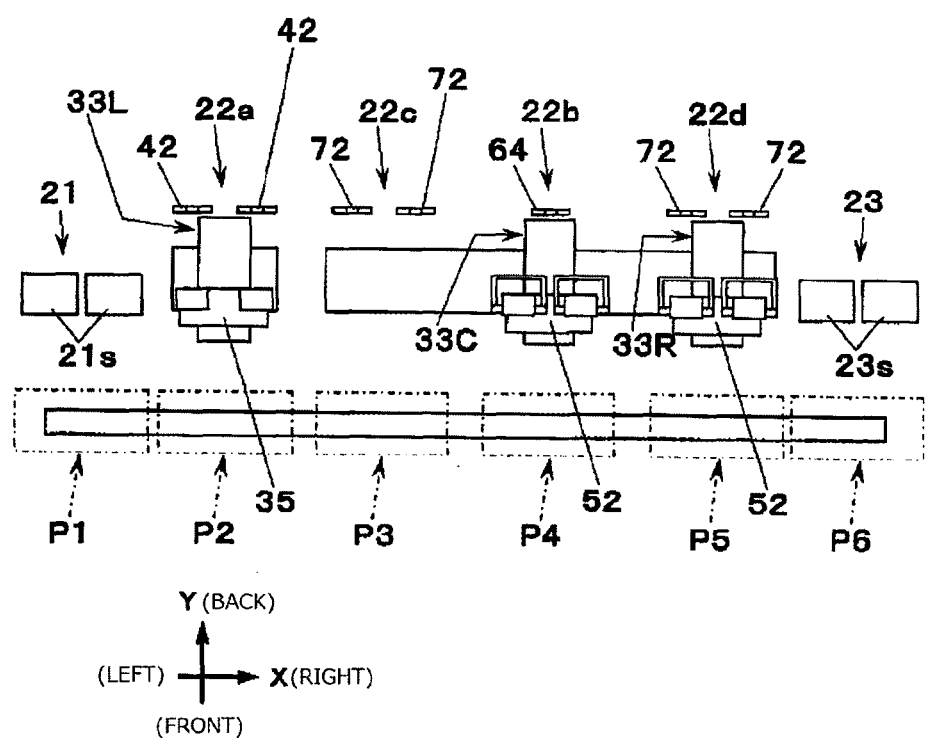
FIG. 15 is a partial plan view of the component mounting device according to the embodiment of the present invention.

An operation of each portion, section, and unit at a time when the component mounting device 1 performs the operation for installing the component 4 on the substrate 2 will be described. As illustrated in FIG. 15, the control device 24 determines a position in front of the carried substrate placement section 21 (first position P1), a position in front of the ACF attachment operation unit 22*a* (second position P2), a position in front of the first component crimping operation unit 22*c* (third position P3), a position in front of the component loading operation unit 22*b* (fourth position P4), a position in front of the second component crimping operation unit 22*d* (fifth position P5), and a position in front of the unloaded substrate placement section 23 (sixth position P6) as positions that are acquired by the three substrate transfer sections 82.

Figure 16:
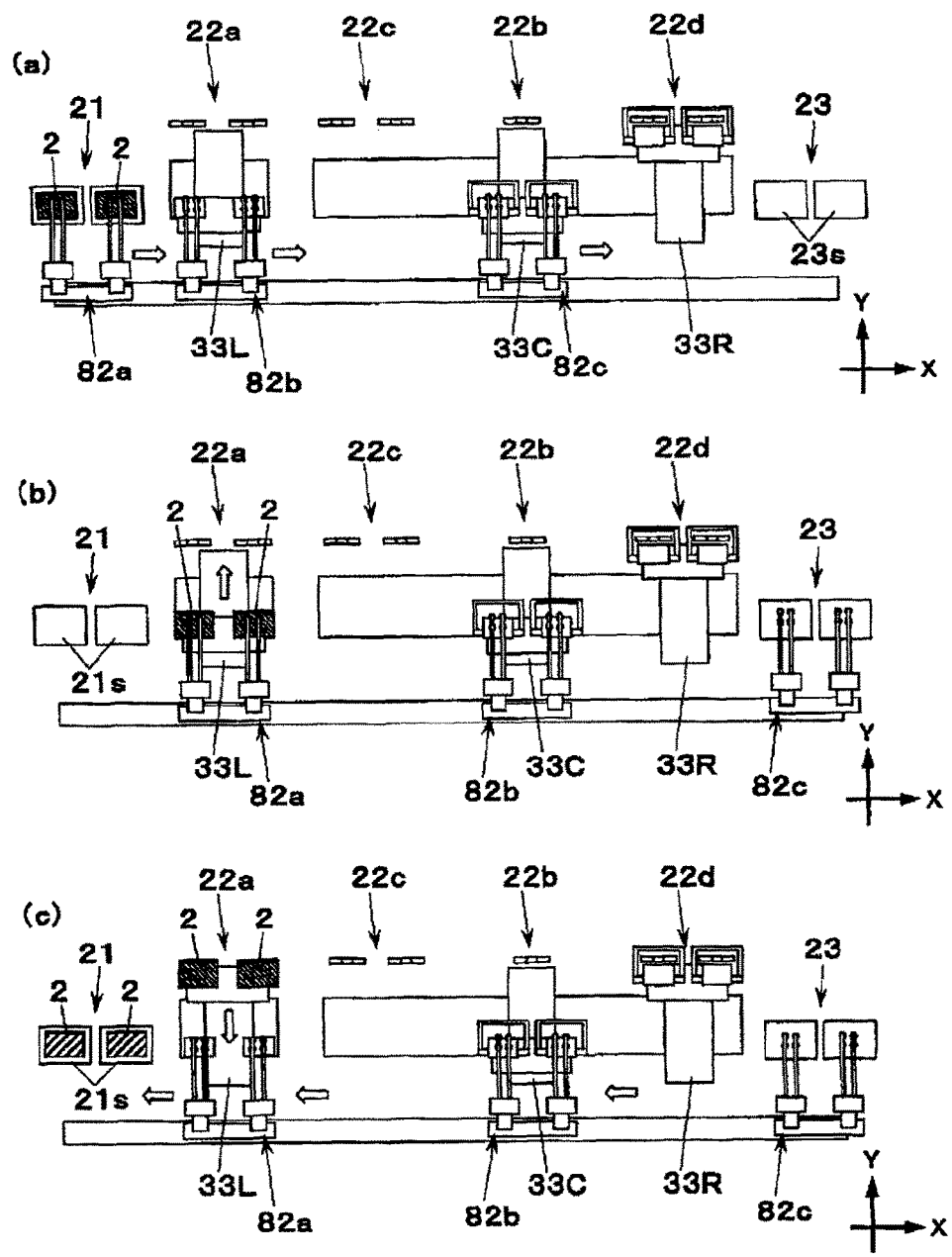
FIGS. 16(a), 16(b), and 16(c) are diagrams illustrating an execution procedure of the component installation operation by the component mounting device according to the embodiment of the present invention.

In a case where the operation for installing the component 4 on the substrate 2 is performed, the control device 24 first positions the left substrate transfer section 82*a* at the first position P1, the central substrate transfer section 82*b* at the second position P2, and the right substrate transfer section 82*c* at the fourth position P4, and the two substrates 2 that are carried from the device on the upstream process side and are placed on the carried substrate placement section 21 are received by the left substrate transfer section 82*a* in a state where the central substrate transport unit 33C is positioned at the position in front of the component loading operation unit 22*b* and the right substrate transport unit 33R is positioned at the position in front of the second component crimping operation unit 22*d* (FIG. 16(*a*)).

After the two substrates 2 are received by the left substrate transfer section 82*a* from the carried substrate placement section 21, the control device 24 delivers the two substrates 2 that are received by the left substrate transfer section 82*a* to the two substrate placement stages 36 of the left substrate transport unit 33L by positioning the left substrate transfer section 82*a* at the second position P2, the central substrate transfer section 82*b* at the fourth position P4, and the right substrate transfer section 82*c* at the sixth position P6 (FIG. 16(*b*)). Then, the moving stage 35 of the left substrate transport unit 33L is moved to the "operation position" and the operation for ACF attachment to the two substrates 2 is executed by the ACF attachment operation unit 22*a* (FIG. 16(*c*)). In this case, two new substrates 2 are placed on (carried onto) the carried substrate placement section 21.

After the operation for ACF attachment to the two substrates 2 is executed by the ACF attachment operation unit 22*a*, the control device 24 moves the moving stage 35 of the left substrate transport unit 33L to the "substrate delivery position". Then, the control device 24 positions the left substrate transfer section 82*a* at the first position P1, the central substrate transfer section 82*b* at the second position P2, and the right substrate transfer section 82*c* at the fourth position P4. Then, the two substrates 2 on the carried substrate placement section 21 are received by the left substrate transfer section 82*a* and the two substrates 2 on the left substrate transport unit 33L are received by the central substrate transfer section 82*b* (FIG. 17(*a*)).

Figure 17:
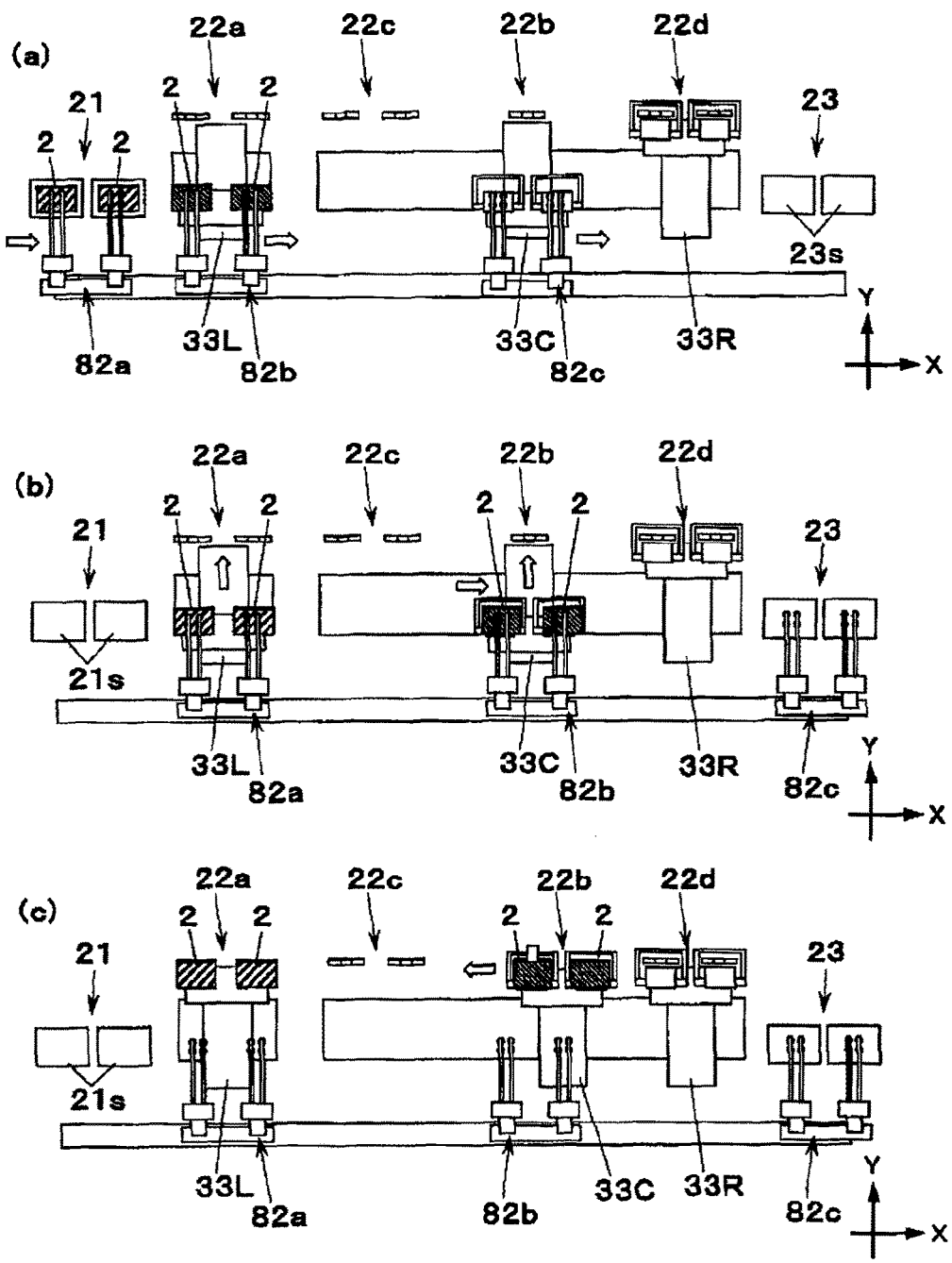
FIGS. 17(a), 17(b), and 17(c) are diagrams illustrating the execution procedure of the component installation operation by the component mounting device according to the embodiment of the present invention.

After the two substrates 2 are received by the left substrate transfer section 82*a* from the carried substrate placement section 21 and the two substrates 2 on the left substrate transport unit 33L are received by the central substrate transfer section 82*b*, the control device 24 places the two substrates 2 that are received by the left substrate transfer section 82*a* on the two substrate placement stages 36 of the left substrate transport unit 33L and places the two substrates 2 that are received by the central substrate transfer section 82*b* on the two substrate placement stages 53 of the central substrate transport unit 33C by positioning the left substrate transfer section 82*a* at the second position P2, the central substrate transfer section 82*b* at the fourth position P4, and the right substrate transfer section 82*c* at the sixth position P6 (FIG. 17(*b*)).

Then, the control device 24 executes the operation for ACF attachment to the two substrates 2 by using the ACF attachment operation unit 22*a* by positioning the moving stage 35 of the left substrate transport unit 33L at the "operation position" and executes the component loading operation on the left substrate 2 by using the component loading operation unit 22*b* by moving the moving stage 52 of the central substrate transport unit 33C to the "operation position" and positioning the left one of the two substrates 2 above the component loading operation backup stage 64 (first transport process) (FIG. 17(*c*), first component loading operation process).

Figure 18:
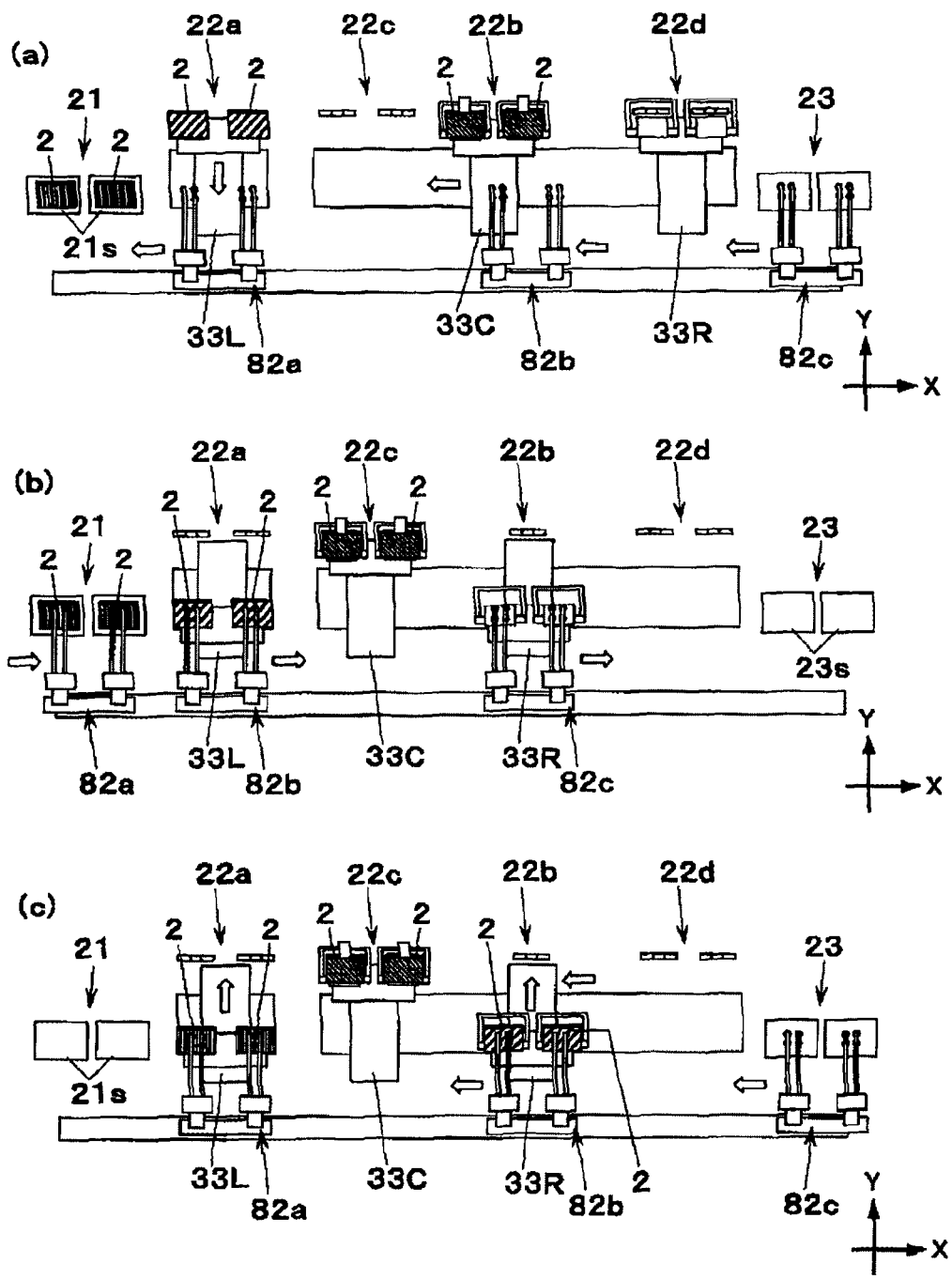
FIGS. 18(a), 18(b), and 18(c) are diagrams illustrating the execution procedure of the component installation operation by the component mounting device according to the embodiment of the present invention.

After the component loading operation on the left substrate 2 is executed by the component loading operation unit 22*b*, the control device 24 moves the central substrate transport unit 33C leftward (second transport process), positions the right one of the two substrates 2 that are placed on the two substrate placement stages 53 of the central substrate transport unit 33C above the component loading operation backup stage 64, and executes the component loading operation on the right substrate 2 by using the component loading operation unit 22*b* (FIG. 18(*a*), second component loading operation process). In this case, two new substrates 2 are placed on (carried onto) the carried substrate placement section 21.

After the component loading operation is executed by the component loading operation unit 22*b*, the control device 24 moves the central substrate transport unit 33C leftward (to the first component crimping operation unit 22*c* side) as it is, transports the substrate 2 in a state of remaining placed on the substrate placement stage 53 to the first component crimping operation unit 22*c* (process for moving to the first component crimping operation unit 22*c*), positions the substrates 2 placed on the two substrate placement stages 53 above the two component crimping operation backup stages 72, and executes the component crimping operation on the two substrates 2 by using the first component crimping operation unit 22c (component crimping operation process by the first component crimping operation unit 22c, FIG. 18(b)). In conjunction with the above, the two substrates 2 that are placed on the carried substrate placement section 21 are received by the left substrate transfer section 82a by positioning the left substrate transfer section 82a at the first position P1 and the two substrates 2 on the left substrate transport unit 33L are received by the central substrate transfer section 82b by positioning the moving stage 35 of the left substrate transport unit 33L at the "substrate delivery position" and positioning the central substrate transfer section 82b at the second position P2. In addition, the right substrate transport unit 33R is positioned at the position in front of the component loading operation unit 22b and the right substrate transfer section 82c is positioned at the fourth position P4 (FIG. 18(b)).

After the operation described above is terminated, the control device 24 delivers the two substrates 2 that are received from the left substrate transport unit 33L to the two substrate placement stages 53 of the right substrate transport unit 33R by positioning the right substrate transfer section 82c at the sixth position P6 and positioning the central substrate transfer section 82b at the fourth position P4 and delivers the two substrates 2 that are received from the carried substrate placement section 21 to the two substrate placement stages 36 of the left substrate transport unit 33L by positioning the left substrate transfer section 82a at the second position P2 (FIG. 18(c)).

Figure 19:
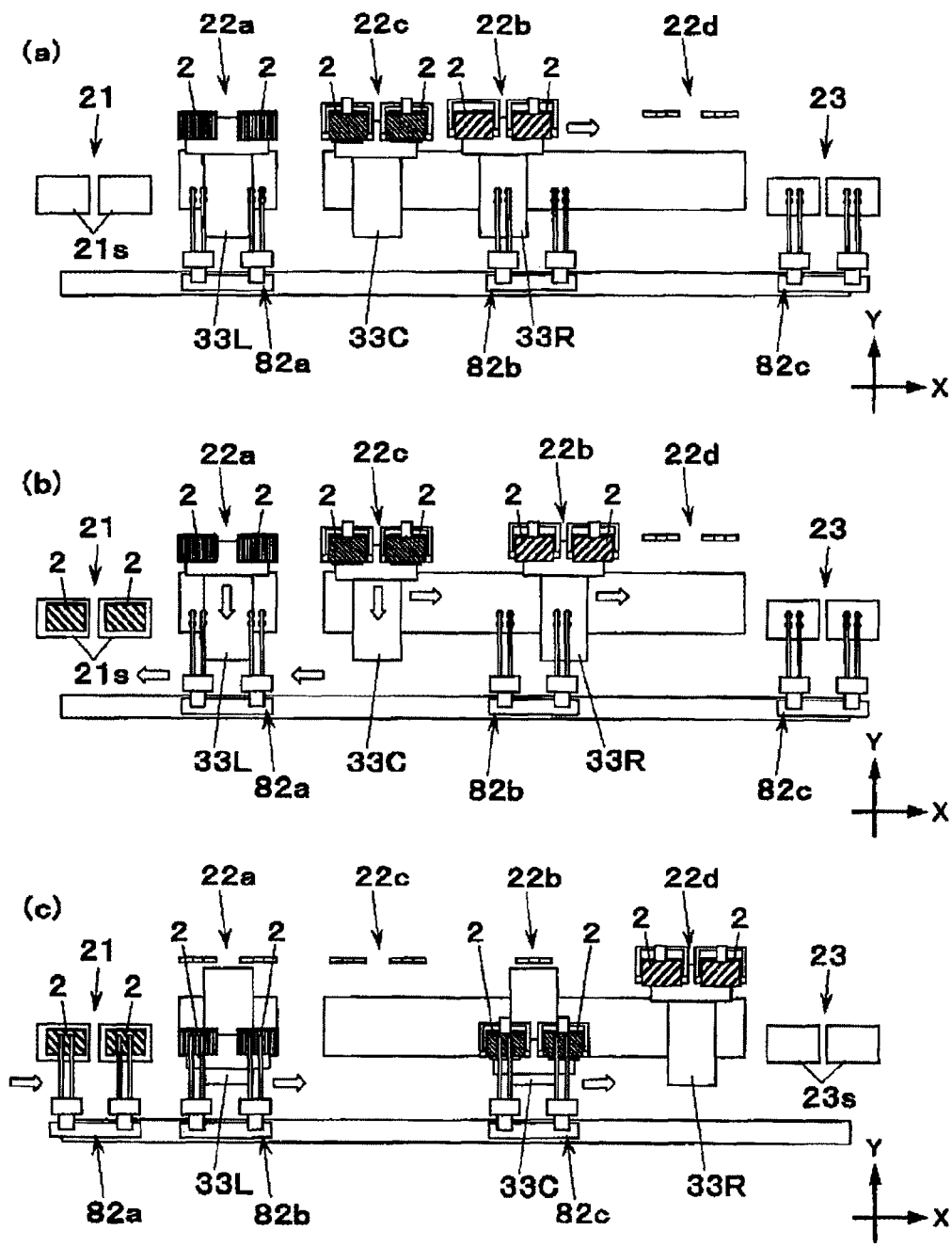
FIGS. 19(a), 19(b), and 19(c) are diagrams illustrating the execution procedure of the component installation operation by the component mounting device according to the embodiment of the present invention.

After the substrates 2 are delivered to the right substrate transport unit 33R and the left substrate transport unit 33L, the control device 24 executes the operation for ACF attachment to the two substrates 2 by using the ACF attachment operation unit 22a by positioning the moving stage 35 of the left substrate transport unit 33L at the "operation position" and positions the right one of the two substrates 2 above the component loading operation backup stage 64 by moving the moving stage 52 of the right substrate transport unit 33R to the "operation position" (third transport process). In this manner, the control device 24 executes the component loading operation on the right substrate 2 by using the component loading operation unit 22b (FIG. 19(a), third component loading operation process).

After the ACF attachment operation by the ACF attachment operation unit 22a and the component loading operation by the component loading operation unit 22b are executed, the control device 24 moves the right substrate transport unit 33R rightward (fourth transport process), positions the left one of the two substrates 2 that are placed on the two substrate placement stages 53 of the right substrate transport unit 33R above the component loading operation backup stage 64, and executes the component loading operation on the left substrate 2 by using the component loading operation unit 22b (FIG. 19(b), fourth component loading operation process). In this case, two new substrates 2 are placed on (carried onto) the carried substrate placement section 21.

After the component loading operation by the component loading operation unit 22b is executed, the control device 24 transports the substrate 2 in a state of remaining placed on the substrate placement stage 53 to the second component crimping operation unit 22d by moving the right substrate transport unit 33R rightward (to the second component crimping operation unit 22d side) as it is (process for moving to the second component crimping operation unit 22d) and executes the component loading operation on the two substrates 2 by using the second component crimping operation unit 22d by positioning the two substrates 2 that are placed on the two substrate placement stages 53 above the two component crimping operation backup stages 72 (component crimping operation process by the second component crimping operation unit 22d, FIG. 19(c)). In conjunction with the above, the two substrates 2 that are placed on the carried substrate placement section 21 are received by the left substrate transfer section 82a by positioning the left substrate transfer section 82a at the first position P1 and the two substrates 2 on the left substrate transport unit 33L are received by the central substrate transfer section 82b by positioning the moving stage 35 of the left substrate transport unit 33L at the "substrate delivery position" and positioning the central substrate transfer section 82b at the second position P2. In addition, the central substrate transport unit 33C is positioned at the position in front of the component loading operation unit 22b while the moving stage 52 of the central substrate transport unit 33C is moved to the "substrate delivery position" so that the two substrates 2 on the central substrate transport unit 33C are received by the right substrate transfer section 82c which is positioned in front of the component loading operation unit 22b (FIG. 19(c)).

Figure 20:
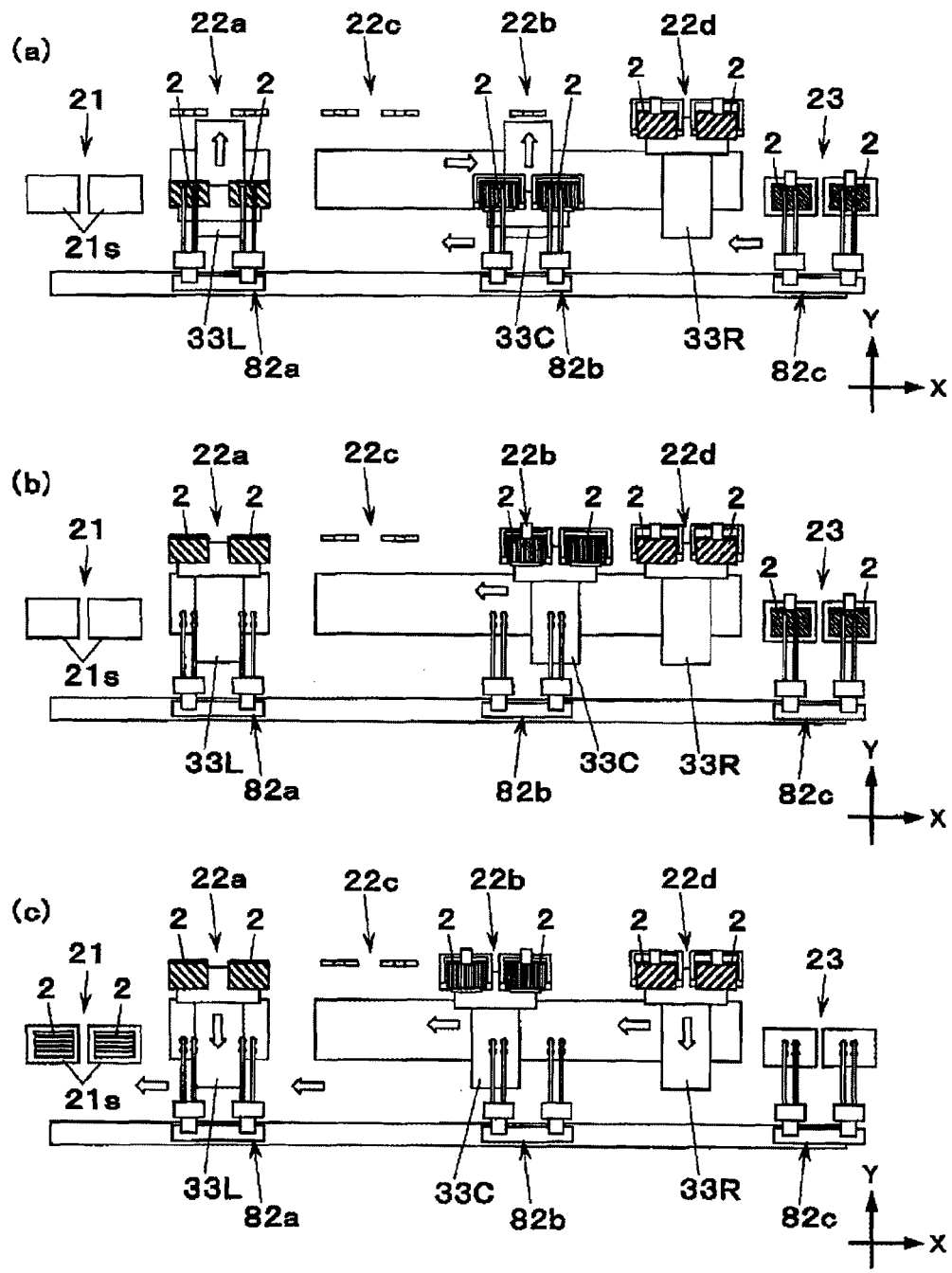
FIGS. 20(a), 20(b), and 20(c) are diagrams illustrating the execution procedure of the component installation operation by the component mounting device according to the embodiment of the present invention.

After the operation described above is terminated, the control device 24 places the two substrates 2 on the unloaded substrate placement section 23 by positioning the right substrate transfer section 82c at the sixth position P6, delivers the two substrates 2 that are received from the left substrate transport unit 33L to the two substrate placement stages 53 of the central substrate transport unit 33C by positioning the central substrate transfer section 82b at the fourth position P4, and delivers the two substrates 2 that are received from the carried substrate placement section 21 to the two substrate placement stages 36 of the left substrate transport unit 33L by positioning the left substrate transfer section 82a at the second position P2 (FIG. 20(a)).

After the substrates 2 are delivered to the central substrate transport unit 33C and the left substrate transport unit 33L, the control device 24 executes the ACF attachment operation on the two substrates 2 by using the ACF attachment operation unit 22a by positioning the moving stage 35 of the left substrate transport unit 33L at the "operation position" and positions the left one of the two substrates 2 above the component loading operation backup stage 64 by positioning the moving stage 52 of the central substrate transport unit 33C at the "operation position" (first transport process). In this manner, the control device 24 executes the component loading operation on the left substrate 2 by using the component loading operation unit 22b (FIG. 20(b), first component loading operation process).

After the ACF attachment operation by the ACF attachment operation unit 22a and the component loading operation by the component loading operation unit 22b are executed, the control device 24 positions the right one of the two substrates 2 that are placed on the two substrate placement stages 53 of the central substrate transport unit 33C above the component loading operation backup stage 64 by moving the central substrate transport unit 33C leftward (second transport process) and executes the component loading operation on the right substrate 2 by using the component loading operation unit 22b (FIG. 20(c), second component loading operation process). In this case, two new substrates 2 are placed on (carried onto) the carried substrate placement section 21.

After the component loading operation is executed by the component loading operation unit 22b, the control device 24 transports the substrate 2 in a state of remaining placed on the substrate placement stage 53 to the first component crimping operation unit 22c by moving the central substrate transport unit 33C leftward (to the first component crimping operation unit 22c side) as it is (process for moving to the first component crimping operation unit 22c) and executes the component crimping operation on the two substrates 2 by using the first component crimping operation unit 22c by positioning the two substrates 2 that are placed on the two substrate placement stages 53 above the component crimping operation backup stages 72 (component crimping operation process by the first component crimping operation unit 22c, FIG. 21(a)). In conjunction with the above, the two substrates 2 that are placed on the carried substrate placement section 21 are received by the left substrate transfer section 82a by positioning the left substrate transfer section 82a at the first position P1 and the two substrates 2 on the left substrate transport unit 33L are received by the central substrate transfer section 82b by positioning the moving stage 35 of the left substrate transport unit 33L at the "substrate delivery position" and positioning the central substrate transfer section 82b at the second position P2. In addition, the two substrates 2 on the right substrate transport unit 33R are received by the right substrate transfer section 82c that is already positioned in front of the component loading operation unit 22b by positioning the right substrate transport unit 33R in front of the component loading operation unit 22b while moving the moving stage 52 of the right substrate transport unit 33R to the "substrate delivery position" (FIG. 21(a)).

After the operation described above is terminated, the control device 24 places the two substrates 2 on the unloaded substrate placement section 23 by positioning the right substrate transfer section 82c at the sixth position P6, delivers the two substrates 2 that are received from the left substrate transport unit 33L to the two substrate placement stages 53 of the right substrate transport unit 33R by positioning the central substrate transfer section 82b at the fourth position P4, and delivers the two substrates 2 that are received from the carried substrate placement section 21 to the two substrate placement stages 36 of the left substrate transport unit 33L by positioning the left substrate transfer section 82a at the second position P2 (FIG. 21(b)).

Figure 21:
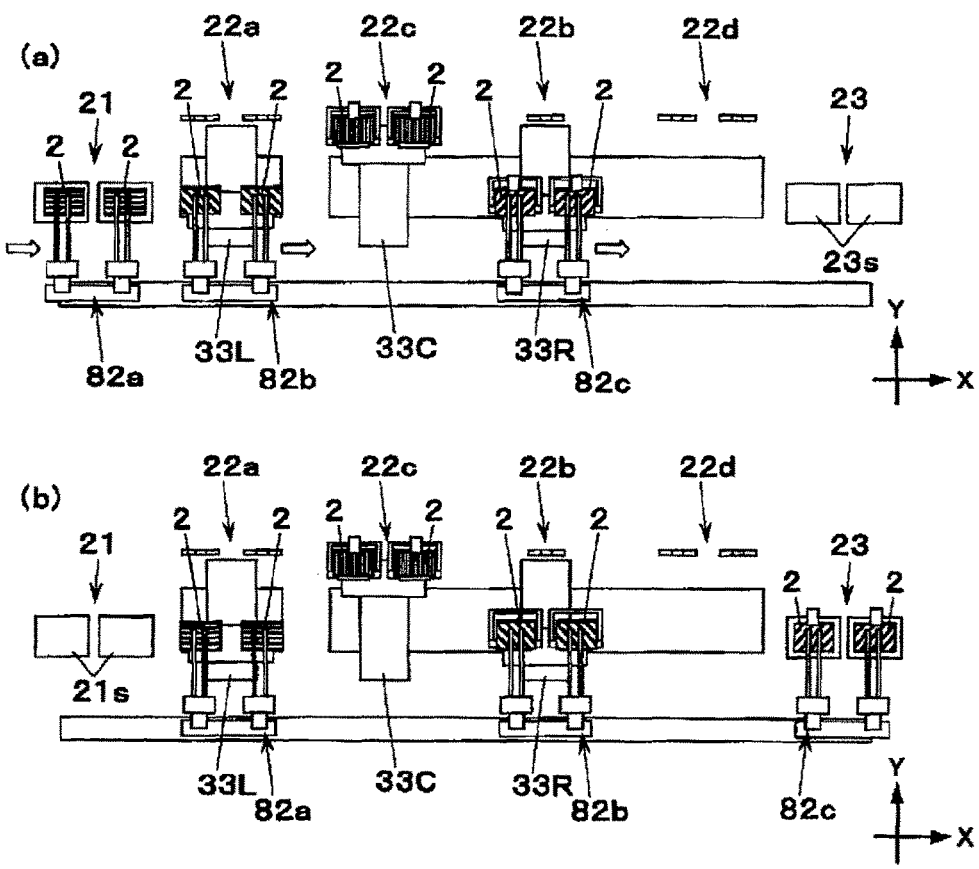
FIGS. 21(a) and 21(b) are diagrams illustrating the execution procedure of the component installation operation by the component mounting device according to the embodiment of the present invention.

The state in FIG. 21(b) is completely identical to the state in FIG. 18(c). Continuous substrate manufacturing can be performed by repeating the process of FIG. 18(c) to FIG. 21(a) and repeatedly executing a series of the operation continuing from the carriage of the substrate 2 to the carried substrate placement section 21 to the unloading onto the unloaded substrate placement section 23 through the installation of the component 4 on the substrate 2.

As described above, the component mounting device 1 according to this embodiment is provided with the component loading operation unit 22b that performs the operation for loading the component 4 on the substrate 2, the first component crimping operation unit 22c and the second component crimping operation unit 22d that are disposed at the positions pinching the component loading operation unit 22b from both sides and crimp the component 4 loaded by the component loading operation unit 22b on the substrate 2 where the operation for loading the component 4 is performed by the component loading operation unit 22b, the central substrate transport unit 33C (a first substrate transport unit) that is disposed to be movable in the horizontal direction between the component loading operation unit 22b and the first component crimping operation unit 22c, transports the substrate 2 to the component loading operation unit 22b in a state where the substrate 2 is placed on the substrate placement stage 53, and transports the substrate 2 in a state of remaining placed on the substrate placement stage 53 to the first component crimping operation unit 22c by moving to the first component crimping operation unit 22c side after the operation for loading the component 4 on the substrate 2 is performed by the component loading operation unit 22b, and the right substrate transport unit 33R (a second substrate transport unit) that is disposed to be movable in the horizontal direction between the component loading operation unit 22b and the second component crimping operation unit 22d, transports the substrate 2 to the component loading operation unit 22b in a state where the substrate 2 is placed on the substrate placement stage 53, and transports the substrate 2 in a state of remaining placed on the substrate placement stage 53 to the second component crimping operation unit 22d by moving to the second component crimping operation unit 22d side after the operation for loading the component 4 on the substrate 2 is performed by the component loading operation unit 22b.

The left substrate transport unit 33L is a substrate holding section that holds the substrate 2 which is carried from outside, and the ACF attachment operation unit 22a is the adhesion member attachment operation unit that attaches the ACF tape 3 as the adhesion member to a site of the substrate 2 held by the left substrate transport unit 33L where the component 4 is loaded by the component loading operation unit 22b.

The central substrate transfer section 82b that is the substrate transfer section 82 is a substrate transfer unit that places the substrates 2, to which the ACF tape 3 is attached by the ACF attachment operation unit 22a, on the substrate placement stage 53 of the central substrate transport unit 33C and the substrate placement stage 53 of the right substrate transport unit 33R through sorting.

The right substrate transfer section 82c that is the substrate transfer section 82 delivers the substrate 2 to the unloaded substrate placement section 23 that is a substrate unloading unit after receiving the substrate 2 where the component 4 is crimped by the first component crimping operation unit 22c from the substrate placement stage 53 of the central substrate transport unit 33C or receiving the substrate 2 where the component 4 is crimped by the second component crimping operation unit 22d from the substrate placement stage 53 of the right substrate transport unit 33R.

Since both the positioning of the substrate 2 with respect to the component loading operation unit 22b and the positioning of the substrate 2 with respect to the component crimping operation unit (first component crimping operation unit 22c or second component crimping operation unit 22d) are performed by recognizing the substrate 2 that is held by the substrate placement stage 53, acquiring the information relating to the position of the substrate 2, and moving the substrate placement stage 53 based on the information obtained in this manner, the number of recognitions of the substrate 2 with respect to the number of positionings of the substrate 2 can be reduced. Accordingly, the operation process can be shortened and productivity of the substrate 2 can be improved. In addition, the recognition unit that recognizes the substrate 2 may be provided with not only the function of recognizing the substrate 2 in the component loading operation unit 22b but also the function as the stage movement control unit of the substrate placement stages 53 and the control device 24 in the component loading operation unit 22b and the component crimping operation unit (first component crimping operation unit 22c or second component crimping operation unit 22d). Accordingly, the configuration of the device can be simplified and manufacturing costs can be saved.

The method for mounting the component by using the component mounting device 1 according to this embodiment includes the process for crimping the component 4 on the substrate 2 by using the first component crimping operation unit 22c (component crimping operation process by the first component crimping operation unit 22c described above) by transporting the substrate 2 in a state of remaining placed on the substrate placement stage 53 to the first component crimping operation unit 22c by moving the central substrate transport unit 33C to the first component crimping operation unit 22c side (process for moving to the first component crimping operation unit 22c described above) after transporting the substrate 2 to the component loading operation unit 22b in a state where the substrate 2 is placed on the substrate placement stage 53 of the central substrate transport unit 33C (first substrate transport unit) (first transport process and second transport process described above) and performing the operation for loading the component 4 on the substrate 2 by using the component loading operation unit 22b (first component loading operation process and the second component loading operation process) and the process for crimping the component 4 on the substrate 2 by using the second component crimping operation unit 22d (component crimping operation process by the second component crimping operation unit 22d described above) by transporting the substrate 2 in a state of remaining placed on the substrate placement stage 53 to the second component crimping operation unit 22d by moving the right substrate transport unit 33R to the second component crimping operation unit 22d side (process for moving to the second component crimping operation unit 22d described above) after transporting the substrate 2 to the component loading operation unit 22b in a state where the substrate 2 is placed on the substrate placement stage 53 of the right substrate transport unit 33R (second substrate transport unit) (third transport process and fourth transport process described above) and performing the operation for loading the component 4 on the substrate 2 by using the component loading operation unit 22b (third component loading operation process and fourth component loading operation process described above).

According to the component mounting device 1 and the component mounting method of this embodiment, the operation for loading the component 4 is performed after the substrate 2 is transported to the component loading operation unit 22b in a state where the substrate 2 is placed on the substrate placement stage 53 of the central substrate transport unit 33C (first substrate transport unit) or the right substrate transport unit 33R (second substrate transport unit), the substrate 2 is transported to the first component crimping operation unit 22c or the second component crimping operation unit 22d in a state of remaining placed on the substrate placement stage 53 after the operation for loading the component 4 is performed, and then the operation for crimping the component 4 is performed. Accordingly, transfer of the substrate 2 by the substrate transfer sections 82 (substrate transfer unit) does not occur during the course of transition from the operation for loading the component 4 to the operation for crimping the component 4, and thus the transition to the operation for crimping the component 4 can be made without dropping the component 4 that is loaded on the substrate 2.

The transfer of the substrate 2 to the central substrate transport unit 33C or the right substrate transport unit 33R by the substrate transfer section 82 (central substrate transfer section 82b) is not limited to the order described in this embodiment. The transfer to the right substrate transport unit 33R may precede the transfer to the central substrate transport unit 33C.

The component loading operation and the component crimping operation by the component loading operation unit 22b, the first component crimping operation unit 22c, and the second component crimping operation unit 22d may be performed from any of the left and right substrate placement stages 36 and 53 of the respectively corresponding substrate transport units (left substrate transport unit 33L, central substrate transport unit 33C, or right substrate transport unit 33R).

The left base 11a, the central base 11b, and the right base 11c may be formed as an integral based or may be formed as separate bases.

Priority is claimed to Japanese Patent Application No. 2012-182911, filed Aug. 22, 2012, and Japanese Patent Application No. 2012-192890, filed Sep. 3, 2012, the entire content of each of which is incorporated herein by reference.

INDUSTRIAL APPLICABILITY

Provided are a component mounting device and a component mounting method allowing transition to a component crimping operation without dropping a component that is loaded on a substrate.

REFERENCE SIGNS LIST

1 Component mounting device
2 Substrate
3 ACF tape (adhesion member)
4 Component
4a Film-shaped part
22a ACF attachment operation unit (adhesion member attachment operation unit)
22b Component loading operation unit
22c First component crimping operation unit
22d Second component crimping operation unit
23 Unloaded substrate placement section (substrate unloading unit)
33L Left substrate transport unit (substrate holding section)
33C Central substrate transport unit (first substrate transport unit)
33R Right substrate transport unit (second substrate transport unit)
53 Substrate placement stage
54 Film-shaped part supporting section
65 Position recognition camera (position recognition unit)
82 Substrate transfer section (substrate transfer unit)

The invention claimed is:

1. A component mounting method operatively associated with a component mounting device said component mounting method comprising: a component loading operation unit that performs an operation for loading components on a substrate, a first component crimping operation unit and a second component crimping operation unit that are disposed at positions pinching the component loading operation unit from both sides and crimp the component loaded by the component loading operation unit on the substrate where the operation for loading the component is performed by the component loading operation unit, a first substrate transport unit disposed to be movable in a horizontal direction between the component loading operation unit and the first component crimping operation unit, and a second substrate transport unit disposed to be movable in the horizontal direction between the component loading operation unit and the second component crimping operation unit, a step of crimping one of the components on the substrate by the first component crimping operation unit by transporting the substrate in a state of remaining placed on a substrate placement stage to the first component crimping operation unit by moving the first substrate transport unit to the first component crimping operation unit side after transporting the substrate to the component loading operation unit in a state where the substrate is placed on the substrate placement stage of the first substrate transport unit and performing the operation for loading the component on the substrate by the component loading operation unit; and a step of crimping one of the components on the substrate by the second component crimping operation unit by transporting the substrate in a state of remaining placed on the substrate placement stage to the second component crimping operation unit by moving the second substrate transport unit to the second component crimping operation unit side after transporting the substrate to the component loading operation unit in a state where the substrate is placed on the substrate placement stage of the second substrate transport unit and performing the operation for loading the component on the substrate by using the component loading operation unit.

2. The component mounting method according to claim 1 further comprising:

an information acquiring step of acquiring information relating to a position of the substrate by recognizing the substrate that is placed on the substrate placement stage;

a first substrate positioning step of performing positioning of the substrate with respect to the component loading operation unit by moving the substrate placement stage based on the information that is acquired in the information acquiring step; and a second substrate positioning step of performing the positioning of the substrate with respect to the first component crimping operation unit by moving the substrate placement stage to the first component crimping operation unit after the loading operation and moving the substrate placement stage based on the information that is acquired in the information acquiring step.

* * * * *